United States Patent
Nakamura et al.

(10) Patent No.: US 6,468,818 B2
(45) Date of Patent: *Oct. 22, 2002

(54) METHOD FOR PRODUCING A HIGH-LUMINANCE SEMICONDUCTOR LIGHT-EMITTING DEVICE CAPABLE OF OPERATING AT A LOW VOLTAGE

(75) Inventors: Junichi Nakamura, Kashiba; Hiroshi Nakatsu, Tenri; Kazuaki Sasaki, Osaka, all of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/490,534

(22) Filed: Jan. 25, 2000

(65) Prior Publication Data

US 2002/0098606 A1 Jul. 25, 2002

(30) Foreign Application Priority Data

Jan. 25, 1999 (JP) .......................... 11-015503

(51) Int. Cl.$^7$ .......................... H01L 21/00; H01L 33/00; H01S 5/00
(52) U.S. Cl. .............................. 438/22; 438/37; 438/46; 438/936; 438/956; 257/96; 257/97; 257/102; 372/45; 372/46
(58) Field of Search .............................. 257/94, 96–98, 257/101–103; 372/45, 46; 438/22, 46, 47, 956, 936, 37

(56) References Cited

U.S. PATENT DOCUMENTS

| | | | |
|---|---|---|---|
| 4,852,110 A | * 7/1989 | Fujii et al. | 372/44 |
| 5,190,891 A | * 3/1993 | Yokotsuka et al. | 117/105 |
| 5,442,203 A | * 8/1995 | Adomi et al. | 257/97 |
| 5,444,269 A | * 8/1995 | Adomi et al. | 257/103 |
| 5,516,723 A | * 5/1996 | Sasaki et al. | 438/44 |
| 5,600,158 A | * 2/1997 | Noto et al. | 257/102 |
| 5,635,733 A | * 6/1997 | Okagawa et al. | 257/94 |
| 5,717,709 A | * 2/1998 | Sasaki et al. | 372/46 |
| 5,744,829 A | * 4/1998 | Murasato et al. | 257/94 |
| 5,777,349 A | * 7/1998 | Nakamura et al. | 257/94 |
| 5,811,839 A | * 9/1998 | Shimoyama et al. | 257/94 |
| 6,278,137 B1 | * 8/2001 | Shimoyama et al. | 257/102 |

FOREIGN PATENT DOCUMENTS

| | | | |
|---|---|---|---|
| DE | 198 03 006 A1 | 7/1998 | |
| DE | 198 08 446 A1 | 9/1998 | |
| EP | 0 702 414 A2 | 3/1996 | |
| JP | 62-200786 A | 9/1987 | |
| JP | 1-184972 A | 7/1989 | |
| JP | 04104995 A | * 4/1992 | .......... C30B/29/40 |
| JP | 04118920 A | * 4/1992 | .......... H01L/21/205 |
| JP | 5-275740 A | 10/1993 | |
| JP | 6-85385 A | 3/1994 | |
| JP | 6-164057 A | 6/1994 | |
| JP | 06326352 A | * 11/1994 | .......... H01L/33/00 |
| JP | 07015038 A | * 1/1995 | .......... H01L/33/00 |
| JP | 07211660 A | * 8/1995 | .......... H01L/21/208 |
| JP | 9-260724 A | 10/1997 | |
| JP | 10125955 A | * 5/1998 | .......... H01L/33/00 |
| JP | 10242510 A | * 9/1998 | .......... H01L/33/00 |
| JP | 11017218 A | * 1/1999 | .......... H01L/33/00 |
| JP | 11112109 A | * 4/1999 | .......... H01S/3/18 |

* cited by examiner

Primary Examiner—Eddie Lee
Assistant Examiner—José R. Díaz
(74) Attorney, Agent, or Firm—Nixon & Vanderhye P.C.

(57) ABSTRACT

A semiconductor light-emitting device has a light-emitting section comprised of at least a lower clad layer, an active layer and an upper clad layer which are formed on a compound semiconductor substrate and a layer grown on the upper clad layer of the light-emitting section. When growing the current diffusion layer from a crystal interface on the upper clad layer in a lattice mismatching state in which the absolute value of a lattice matching factor $\Delta a/a$ is not lower than 0.25% with respect to the upper clad layer at a crystal interface where the crystal composition changes on the upper clad layer of the light-emitting section, the growth rate at least at the start time of growth is made to be 1.0 $\mu$m/h or less.

41 Claims, 18 Drawing Sheets

WHEN INTERMEDIATE LAYER IS NOT EMPLOYED

WHEN INTERMEDIATE LAYER IS EMPLOYED

WHEN INTERMEDIATE LAYER
IS NOT EMPLOYED

WHEN INTERMEDIATE LAYER
IS EMPLOYED

METHOD FOR PRODUCING A HIGH-LUMINANCE SEMICONDUCTOR LIGHT-EMITTING DEVICE CAPABLE OF OPERATING AT A LOW VOLTAGE

BACKGROUND OF THE INVENTION

The present invention relates to a method for producing a semiconductor light-emitting device.

In order to form a high-luminance semiconductor light-emitting device, it is important to increase the light emission efficiency as well as to achieve the improvement of current injection into the light-emitting section and the effective takeout of light to the outside of the device. In order to improve the current injection into the light-emitting section, a current diffusion layer, an intermediate layer capable of increasing the operating voltage and so on are effective, and the current diffusion layer is also effective for the purpose of achieving effective takeout of light to the outside of the device.

FIG. 28 shows a sectional view of a semiconductor light-emitting device having a current diffusion layer and an intermediate layer (prior art reference of Japanese Patent Laid-Open Publication No. HEI 9-260724). Referring to FIG. 28, an n-type AlGaInP lower clad layer 212, an AlGaInP active layer 213 and a p-type AlGaInP upper clad layer 214 are laminated on an n-type GaAs substrate 211, and a p-type AlGaInP intermediate layer 215 and a p-type GaP current diffusion layer 216 are laminated on the above processed base. Further, a p-type electrode 217, an n-type electrode 218 are formed by vapor deposition, completing a semiconductor light-emitting device. The composition of the p-type AlGaInP intermediate layer 215 is selected so as to satisfy the condition that its lattice matching factor is intermediate between that of the p-type AlGaInP upper clad layer 214 and that of the p-type GaP current diffusion layer 216, the condition that its conduction band lower end is intermediate between the conduction band lower end of the upper clad layer and the conduction band lower end of the current diffusion layer and/or the condition that its valence band upper end thereof is intermediate between the valence band upper end of the upper clad layer and the valence band upper end of the current diffusion layer in an energy position prior to the formation of a junction for the lowering of a hetero barrier in the energy band profile.

In this semiconductor light-emitting device, a current can be injected into not only a portion just below the electrode but also the entire active layer due to the provision of the p-type GaP current diffusion layer 216. FIGS. 29A and 29B show a band profile of a portion extending from the upper clad layer to the current diffusion layer. As shown in FIG. 29B, due to the provision of the p-type AlGaInP intermediate layer 215, energy discontinuity can be divided and reduced as compared with the one that has no intermediate layer shown in FIG. 29A. Therefore, the hetero barrier generated at the interface between the p-type AlGaInP upper clad layer 214 and the p-type GaP current diffusion layer 216 can be lowered. Furthermore, as compared with the one that employs no intermediate layer shown in FIG. 30A, according to this semiconductor light-emitting device shown in FIG. 30B, the lattice mismatching is alleviated by selecting a composition of a lattice constant of 5.55 Å that is intermediate between the lattice constant of 5.65 Å of the p-type AlGaInP upper clad layer 214 and the lattice constant of 5.45 Å of the p-type GaP current diffusion layer 216. With this arrangement, interface state densities generated at the interface between the upper clad layer 214 and the current diffusion layer 216 can be reduced, allowing the reduction of warp of band profile caused by the interface state densities. Therefore, as shown in FIG. 30B, the energy barriers at the interface can be reduced. By virtue of the effect of reducing these energy barriers, the operating voltage can be sharply reduced.

In the aforementioned semiconductor light-emitting device, the lattice mismatching is alleviated by employing AlGaInP having a lattice constant of 5.65 Å for the upper clad layer 214, employing AlGaInP having a lattice constant of 5.55 Å for the intermediate layer 215 and employing GaP having a lattice constant of 5.45 Å for the current diffusion layer 216. In contrast to this, there is still existing a large lattice mismatching of a lattice matching factor $\Delta a/a$ of about $-1.8\%$ between the p-type AlGaInP upper clad layer 214 and the p-type AlGaInP intermediate layer 215 and between the p-type AlGaInP intermediate layer 215 and the p-type GaP current diffusion layer 216. If such a large lattice mismatching exists, then it is difficult to grow a layer having good crystallinity above the interface where the lattice mismatching occurs, and a great many crystal defects such as crosshatch and hillock occur. In the above semiconductor light-emitting device, a great many crystal defects occur in the p-type AlGaInP intermediate layer 215 and the p-type GaP current diffusion layer 216, and the current diffusion and light transmittance are degraded in the current diffusion layer. This consequently causes degradation in light takeout efficiency and degradation in current injection efficiency. Furthermore, if the lattice mismatching exists, then a great many interface state densities occur at the interface. In this semiconductor light-emitting device, a great many interface state densities occur at the interface above and below the intermediate layer. As shown in FIG. 30B, the band profile from the upper clad layer to the current diffusion layer is alleviated by the intermediate layer, whereas the band profile at the hetero interface is sharply warped by the interface state densities, as a consequence of which the operating voltage is still not sufficiently lowered.

The aforementioned bad influence consequently causes a reduction in light takeout efficiency, a reduction in injection efficiency and an increase in operating voltage, and this leads to degradation in luminance, an increase in operating voltage and so on of the semiconductor light-emitting device. Furthermore, the crystal defects caused by the lattice mismatching exert many bad influences on the morphology of the surface of the semiconductor light-emitting device as well as the bad influences of the degraded adhesion of the electrode formed on the current diffusion layer and the disengagement of the electrode, and this leads to a reduced productivity as a consequence of a reduction in yield of production.

SUMMARY OF THE INVENTION

Accordingly, the object of the present invention is to provide a method for producing a high-productivity high-luminance semiconductor light-emitting device capable of operating at a low voltage.

In order to achieve the aforementioned object, the present invention provides a method for producing a semiconductor light-emitting device having a light-emitting section comprised of at least a lower clad layer, an active layer and an upper clad layer which are formed on a compound semiconductor substrate and a layer grown on the upper clad layer of the light-emitting section, wherein when growing the layer on the upper clad layer from a crystal interface where crystal composition on the upper clad layer of the light-emitting section changes in a lattice mismatching state in which the absolute value of a lattice matching factor Δa/a between fore and hind crystals of the crystal interface is not lower than 0.25%, a growth rate at least at a start time of growth is made to be not greater than 1.0 μm/h.

According to the above method of the present invention, the crystallinity of the layer to be grown on an interface where the lattice mismatching exists can be improved by setting a growth rate of not greater than 1.0 μm/h at least in the initial stage of growth when growing the layer from a crystal interface where the crystal composition changes and there is a lattice mismatching of a lattice matching factor Δa/a of which the absolute value is not smaller than 0.25% between the fore and hind crystals. As a result, the transmittance of light emitted from the light-emitting section is increased, and the diffusion of current injected from the electrode and the efficiency of injection are increased. The adhesion of the electrode formed on the layer grown from the crystal interface to the layer is increased, and this leads to an increased yield. Therefore, a high-luminance high-productivity semiconductor light-emitting device can be obtained.

In an embodiment of the present invention, the layer grown on the upper clad layer of the light-emitting section includes at least one of a current diffusion layer and a current stopping layer.

According to the above embodiment, the crystallinity of the current diffusion layer or the current stopping layer can be improved by setting the growth rate of not greater than 1.0 μm/h at least in the growth start stage of the current diffusion layer or the current stopping layer when there is a lattice mismatching of a lattice matching factor Δa/a of which the absolute value is not smaller than 0.25% between the current diffusion layer or the current stopping layer and the layer grown below the above layer. This enables the improvement of current diffusion or current stopping efficiency. Therefore, the diffusion of the current injected from the upper electrode and the injection efficiency are increased, and the transmittance of light emitted from the light-emitting section is increased in the current diffusion layer or the current stopping layer. Furthermore, the adhesion of the upper electrode formed on the current diffusion layer or the current stopping layer is increased, improving the yield of production. Therefore, a high-luminance high-productivity light-emitting device can be obtained.

The present invention also provides a method for producing a semiconductor light-emitting device having a light-emitting section comprised of at least a lower clad layer, an active layer and an upper clad layer which are formed on a compound semiconductor substrate, an intermediate layer formed on the upper clad layer of the light-emitting section and a layer grown on the intermediate layer, the intermediate layer being made of a material selected so as to satisfy a condition that a conduction band lower end of the intermediate layer is intermediate between a conduction band lower end of the upper clad layer and a conduction band lower end of the layer grown on the intermediate layer or a condition that a valence band upper end of the intermediate layer is intermediate between a valence band upper end of the upper clad layer and a valence band upper end of the layer grown on the intermediate layer in an energy position prior to the formation of a junction, wherein when growing the intermediate layer on the upper clad layer in a lattice mismatching state in which the absolute value of a lattice matching factor Δa/a is not lower than 0.25% with respect to the upper clad layer, a growth rate at least at a start time of growth is made to be not greater than 1.0 μm/h.

According to the above method of the invention, there is formed on the upper clad layer the intermediate layer so as to satisfy the condition that the conduction band lower end of the layer is intermediate between the conduction band lower end of the upper clad layer and the conduction band lower end of the layer grown on the intermediate layer and/or the condition that the valence band upper end of the layer is intermediate between the valence band upper end of the upper clad layer and the valence band upper end of the layer grown on the intermediate layer in the energy position prior to the formation of the junction. By setting the growth rate of not greater than 1.0 μm/h at least in the initial stage of growth when growing the intermediate layer in the case where a lattice mismatching of a lattice matching factor Δa/a of which the absolute value is not smaller than 0.25% exists between the upper clad layer and the intermediate layer, the interface state densities caused by the lattice mismatching at the interface between the upper clad layer and the intermediate layer can be reduced, by which the warp of the band profile at the interface between the upper clad layer and the intermediate layer can be suppressed, allowing the operating voltage of the semiconductor light-emitting device to be reduced. Furthermore, the crystallinity of the layer grown on the intermediate layer is improved, and this consequently improves the transmittance of light emitted from the light-emitting section as well as the diffusion and injection efficiency of the current injected from the upper electrode. The adhesion of the electrode provided on the layer grown on the intermediate layer to the layer is increased, improving the yield of production. Therefore, a high-luminance high-productivity light-emitting device capable of operating at a low voltage can be obtained.

The present invention also provides a method for producing a semiconductor light-emitting device having a light-emitting section comprised of at least a lower clad layer, an active layer and an upper clad layer which are formed on a compound semiconductor substrate, an intermediate layer formed on the upper clad layer of the light-emitting section and a layer grown on the intermediate layer, the intermediate layer being made of a material selected so as to satisfy a condition that a conduction band lower end of the intermediate layer is intermediate between a conduction band lower end of the upper clad layer and a conduction band lower end of the layer grown on the intermediate layer or a condition that a valence band upper end of the intermediate layer is intermediate between a valence band upper end of the upper clad layer and a valence band upper end of the layer grown on the intermediate layer in an energy position prior to the formation of a junction, wherein when growing the layer on the intermediate layer in a lattice mismatching state in which the absolute value of a lattice matching factor Δa/a is not lower than 0.25% with respect to the intermediate layer, a growth rate at least at a start time of growth is made to be not greater than 1.0 μm/h.

According to the above method of the invention, there is formed on the upper clad layer the intermediate layer so as to satisfy the condition that the conduction band lower end of the layer is intermediate between the conduction band lower end of the upper clad layer and the conduction band lower end of the layer grown on the intermediate layer and/or the condition that the valence band upper end of the layer is intermediate between the valence band upper end of the upper clad layer and the valence band upper end of the layer grown on the intermediate layer in the energy position prior to the formation of the junction. By setting the growth rate of not greater than 1.0 μm/h at least in the initial stage of growth when growing the layer on the intermediate layer in the case where a lattice mismatching of a lattice matching factor Δa/a of which the absolute value is not smaller than 0.25% exists between the intermediate layer and the layer grown on the intermediate layer, the interface state densities caused by the lattice mismatching at the interface between the intermediate layer and the layer grown on the intermediate layer can be reduced. Therefore, the warp of the band profile at the interface between the intermediate layer and the layer grown on the intermediate layer can be suppressed, allowing the operating voltage of the semiconductor light-emitting device to be reduced. Furthermore, the crystallinity of the layer grown on the intermediate layer is improved, and this consequently improves the transmittance of light emitted from the light-emitting section as well as the diffusion and injection efficiency of the current injected from the upper electrode. The adhesion of the electrode provided on the layer grown on the intermediate layer to the layer is increased, improving the yield of production. Therefore, a high-luminance high-productivity light-emitting device capable of operating at a low voltage can be obtained.

The present invention also provides a method for producing a semiconductor light-emitting device having a light-emitting section comprised of at least a lower clad layer, an active layer and an upper clad layer which are formed on a compound semiconductor substrate, an intermediate layer formed on the upper clad layer of the light-emitting section and a layer grown on the intermediate layer, the intermediate layer being made of a material selected so as to satisfy a condition that a conduction band lower end of the intermediate layer is intermediate between a conduction band lower end of the upper clad layer and a conduction band lower end of the layer grown on the intermediate layer or a condition that a valence band upper end of the intermediate layer is intermediate between the valence band upper end of the upper clad layer and a valence band upper end of the layer grown on the intermediate layer is satisfied in an energy position prior to the formation of a junction, wherein when growing the intermediate layer on the upper clad layer in a lattice mismatching state in which the absolute value of a lattice matching factor Δa/a is not lower than 0.25% with respect to the upper clad layer and when growing the layer on the intermediate layer in a lattice mismatching state in which the absolute value of the lattice matching factor Δa/a is not lower than 0.25% with respect to the intermediate layer, a growth rate at least at a start time of growth is made to be not greater than 1.0 μm/h.

According to the above method of the invention, there is formed on the upper clad layer the intermediate layer so as to satisfy the condition that the conduction band lower end of the layer is intermediate between the conduction band lower end of the upper clad layer and the conduction band lower end of the layer grown on the intermediate layer and/or the condition that the valence band upper end of the layer is intermediate between the valence band upper end of the upper clad layer and the valence band upper end of the layer grown on the intermediate layer in the energy position prior to the formation of the junction. By setting the growth rate of not greater than 1.0 μm/h at least in the initial stage of growth when growing the intermediate layer and the layer on the intermediate layer in the case where a lattice mismatching of a lattice matching factor Δa/a of which the absolute value is not smaller than 0.25% exists between the intermediate layer and the layer grown on the intermediate layer and a lattice mismatching of a lattice matching factor Δa/a of which the absolute value is not smaller than 0.25% exists between the upper clad layer and the intermediate layer, the interface state densities caused by both the lattice mismatching at the interface between the intermediate layer and the layer grown on the intermediate layer and the interface between the intermediate layer and the layer grown on the intermediate layer can be reduced. Therefore, the warp of the band profile at the interface between the intermediate layer and the layer grown on the intermediate layer and the interface between the intermediate layer and the layer grown on the intermediate layer can be suppressed, allowing the operating voltage of the semiconductor light-emitting device to be reduced. Furthermore, the crystallinity of the layer grown on the intermediate layer is improved, and this consequently improves the transmittance of light emitted from the light-emitting section as well as the diffusion and injection efficiency of the current injected from the upper electrode. The adhesion of the electrode provided on the layer grown on the intermediate layer to the layer is increased, improving the yield of production. Therefore, a high-luminance high-productivity light-emitting device capable of operating at a low voltage can be obtained.

The present invention also provides a method for producing a semiconductor light-emitting device having a light-emitting section comprised of at least a lower clad layer, an active layer and an upper clad layer which are formed on a compound semiconductor substrate, an intermediate layer formed on the upper clad layer of the light-emitting section and a layer grown on the intermediate layer, the intermediate layer having a lattice constant intermediate between a lattice constant of the upper clad layer and a lattice constant of the layer grown on the intermediate layer, wherein when growing the intermediate layer on the upper clad layer in a lattice mismatching state in which the absolute value of a lattice matching factor Δa/a is not lower than 0.25% with respect to the upper clad layer, a growth rate at least at a start time of growth is made to be not greater than 1.0 μm/h.

According to the above method of the invention, there is formed on the upper clad layer the intermediate layer having a lattice constant intermediate between the lattice constant of the upper clad layer and the lattice constant of the layer grown on the intermediate layer. By setting the growth rate of not greater than 1.0 μm/h at least in the initial stage of growth when growing the intermediate layer on the upper clad layer in the case where a lattice mismatching of a lattice matching factor Δa/a of which the absolute value is not smaller than 0.25% exists between the upper clad layer and the intermediate layer, the interface state densities caused by the lattice mismatching at the interface between the upper clad layer and the intermediate layer can be reduced, by which the warp of the band profile at the interface between the upper clad layer and the intermediate layer can be suppressed, allowing the operating voltage of the semiconductor light-emitting device to be reduced. Furthermore, the crystallinity of the layer grown on the intermediate layer is improved, and this consequently improves the transmittance of light emitted from the light-emitting section as well as the diffusion and injection efficiency of the current injected from the upper electrode. The adhesion of the electrode provided on the layer grown on the intermediate layer to the layer is increased, improving the yield of production. Therefore, a high-luminance high-productivity light-emitting device capable of operating at a low voltage can be obtained.

The present invention also provides a method for producing a semiconductor light-emitting device having a light-emitting section comprised of at least a lower clad layer, an active layer and an upper clad layer which are formed on a compound semiconductor substrate, an intermediate layer formed on the upper clad layer of the light-emitting section and a layer grown on the intermediate layer, the intermediate layer having a lattice constant intermediate between a lattice constant of the upper clad layer and a lattice constant of the layer grown on the intermediate layer, wherein when growing the layer on the intermediate layer in a lattice mismatching state in which the absolute value of a lattice matching factor $\Delta a/a$ is not lower than 0.25% with respect to the intermediate layer, a growth rate at least at a start time of growth is made to be not greater than 1.0 $\mu$m/h.

According to the above method of the invention, there is formed on the upper clad layer the intermediate layer having a lattice constant intermediate between the lattice constant of the upper clad layer and the lattice constant of the layer grown on the intermediate layer. By setting the growth rate of not greater than 1.0 $\mu$m/h at least in the initial stage of growth when growing the layer on the intermediate layer in the case where a lattice mismatching of a lattice matching factor $\Delta a/a$ of which the absolute value is not smaller than 0.25% exists between the intermediate layer and the layer grown on the intermediate layer, the interface state densities caused by the lattice mismatching at the interface between the intermediate layer and the layer grown on the intermediate layer can be reduced, by which the warp of the band profile at the interface between the intermediate layer and the layer grown on the intermediate layer can be suppressed, allowing the operating voltage of the semiconductor light-emitting device to be reduced. Furthermore, the crystallinity of the layer grown on the intermediate layer is improved, and this consequently improves the transmittance of light emitted from the light-emitting section as well as the diffusion and injection efficiency of the current injected from the upper electrode. The adhesion of the electrode provided on the layer grown on the intermediate layer to the layer is increased, improving the yield. Therefore, a high-luminance high-productivity light-emitting device capable of operating at a low voltage can be obtained.

The present invention also provides a method for producing a semiconductor light-emitting device having a light-emitting section comprised of at least a lower clad layer, an active layer and an upper clad layer which are formed on a compound semiconductor substrate, an intermediate layer formed on the upper clad layer of the light-emitting section and a layer grown on the intermediate layer, the intermediate layer having a lattice constant intermediate between a lattice constant of the upper clad layer and a lattice constant of the layer grown on the intermediate layer, wherein when growing the intermediate layer on the upper clad layer in a lattice mismatching state in which the absolute value of a lattice matching factor $\Delta a/a$ is not lower than 0.25% with respect to the upper clad layer and when growing the layer on the intermediate layer in a lattice mismatching state in which the absolute value of the lattice matching factor $\Delta a/a$ is not lower than 0.25% with respect to the intermediate layer, a growth rate at least at a start time of growth is made to be not greater than 1.0 $\mu$m/h.

According to the above method of the invention, there is formed on the upper clad layer the intermediate layer having a lattice constant intermediate between the lattice constant of the upper clad layer and the lattice constant of the layer grown on the intermediate layer. By setting the growth rate of not greater than 1.0 $\mu$m/h at least in the initial stage of growth when growing the layer on the intermediate layer in the case where a lattice mismatching of a lattice matching factor $\Delta a/a$ of which the absolute value is not smaller than 0.25% exists between the upper clad layer and the intermediate layer and growing the layer on the intermediate layer in the case where a lattice mismatching of a lattice matching factor $\Delta a/a$ of which the absolute value is not smaller than 0.25% exists between the intermediate layer and the layer grown on the intermediate layer, the interface state densities caused by the lattice mismatching both at the interface between the intermediate layer and the layer grown on the intermediate layer and the interface between the intermediate layer and the layer grown on the intermediate layer can be reduced, by which the warp of the band profile at the interface between the intermediate layer and the layer grown on the intermediate layer and the interface between the intermediate layer and the upper clad layer can be suppressed, allowing the operating voltage of the semiconductor light-emitting device to be reduced. Furthermore, the crystallinity of the layer grown on the intermediate layer is improved, and this consequently improves the transmittance of light emitted from the light-emitting section as well as the diffusion and injection efficiency of the current injected from the upper electrode. The adhesion of the electrode provided on the layer grown on the intermediate layer to the layer is increased, improving the yield. Therefore, a high-luminance high-productivity light-emitting device capable of operating at a low voltage can be obtained.

In one embodiment of the invention, the layer grown on the intermediate layer includes at least one of a current diffusion layer and a current stopping layer.

According to the above embodiment, when forming the current diffusion layer or the current stopping layer on the intermediate layer, the crystallinity of the current diffusion layer or the current stopping layer can be improved. This improves the current diffusion and current stopping efficiency, improves the transmittance of light emitted from the light-emitting section in the current diffusion layer or the current stopping layer and improves the diffusion or injection efficiency of the current injected from the upper electrode. The adhesion of the upper electrode formed on the current diffusion layer or the current stopping layer to the layer is increased, improving the productivity. Therefore, a high-luminance high-productivity light-emitting device capable of operating at a low voltage can be obtained.

In one embodiment of the invention, the intermediate layer is comprised of two or more layers.

According to the above embodiment, even in the semiconductor light-emitting device in which the intermediate layer is constructed of two or more layers, the generation of interface state densities and the degradation of crystallinity caused by the lattice mismatching at the interface between the intermediate layer and the upper clad layer and the interface between the intermediate layer and the layer formed on the intermediate layer can be suppressed. Therefore, a high-luminance high-productivity light-emitting device capable of operating at a low voltage can be similarly obtained.

In one embodiment of the invention, when growing an (n+1)-th intermediate layer in a lattice mismatching state in which the absolute value of a lattice matching factor $\Delta a/a$ is not lower than 0.25% with respect to an n-th grown intermediate layer of the intermediate layers, a growth rate at least at a start time of growth is made to be not greater than 1.0 $\mu$m/h.

According to the above embodiment, by setting a growth rate of not greater than 1.0 $\mu$m/h at least in the growth start stage when growing the (n+1)-th intermediate layer in the case where a lattice mismatching of a lattice matching factor Δa/a of which the absolute value is not lower than 0.25% exists between the n-th grown intermediate layer and the (n+1)-th intermediate layer, the generation of interface state densities and the degradation of crystallinity due to the lattice mismatching at the interface between the intermediate layers can be suppressed. Therefore, a high-luminance high-productivity light-emitting diode capable of operating at a low voltage can be obtained.

In one embodiment of the invention, at least one layer out of the layers of which the growth rate at the start time of growth is not greater than 1.0 μm/h is made to have a growth rate of greater than 1 μm/h except when starting the growth.

According to the above embodiment, by setting a growth rate greater than 1 μm/h except when starting the growth for at least one layer out of the layers of which the growth rate in the growth start stage is set not greater than 1.0 μm/h, the time necessary for the growth can be reduced, allowing the time necessary for producing the semiconductor light-emitting device to be reduced. Therefore, a less expensive semiconductor light-emitting device can be obtained.

In one embodiment of the invention, the lower clad layer, the active layer, the upper clad layer, the intermediate layer, the current diffusion layer and the current stopping layer are made of $(Al_xGa_{1-x})_yIn_{1-y}P$ ($0 \leq x \leq 1$, $0 \leq y \leq 1$).

According to the above embodiment, by using $(Al_xGa_{1-x})_yIn_{1-y}P$ ($0 \leq x \leq 1$, $0 \leq y \leq 1$) for the lower clad layer, the active layer, the upper clad layer, the intermediate layer, the current diffusion layer and the current stopping layer, a high-luminance high-productivity light-emitting device capable of operating at a low voltage can be obtained.

In one embodiment of the invention, the lower clad layer, the active layer and the upper clad layer are made of $(Al_xGa_{1-x})_yIn_{1-y}P$ ($0 \leq x \leq 1$, $0 \leq y \leq 1$) and the current diffusion layer and the current stopping layer are made of GaP.

According to the above embodiment, by employing $(Al_xGa_{1-x})_yIn_{1-y}P$ ($0 \leq x \leq 1$, $0 \leq y \leq 1$) for the lower clad layer, the active layer and the upper clad layer and employing GaP for the current diffusion layer and the current stopping layer, a high-luminance high-productivity light-emitting device capable of operating at a low voltage can be obtained.

In one embodiment of the invention, a growth temperature at the time of ending the growth of the upper clad layer and growth temperatures of the intermediate layer and the current diffusion layer are made higher than a growth temperature of the light-emitting section except for the growth temperature at the time of ending the growth of the upper clad layer.

According to the above embodiment, by making the growth temperature at the time of ending the growth of the upper clad layer and the growth temperatures of the intermediate layer and the current diffusion layer higher than the growth temperature of the light-emitting section except for the growth temperature at the time of ending the growth of the upper clad layer, the crystallinity of the layer grown from the interface where the lattice mismatching occurs can be improved. As a result, the transmittance of light emitted from the light-emitting section is improved, and the diffusion or injection efficiency of the current injected from the upper electrode is improved. The adhesion of the electrode provided on the layer grown from the interface where the lattice mismatching occurs to the layer is increased, improving the productivity. Therefore, a high-luminance high-productivity light-emitting device capable of operating at a low voltage can be obtained.

In one embodiment of the invention, the lower clad layer, the active layer, the upper clad layer, the intermediate layer, the current diffusion layer and the current stopping layer are grown by a metal-organic chemical vapor deposition method.

According to the above embodiment, by using the metal-organic chemical vapor deposition method for the growth of the lower clad layer, the active layer, the upper clad layer, the intermediate layer, the current diffusion layer and the current stopping layer, a high-luminance high-productivity light-emitting device capable of operating at a low voltage can be easily produced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 31:
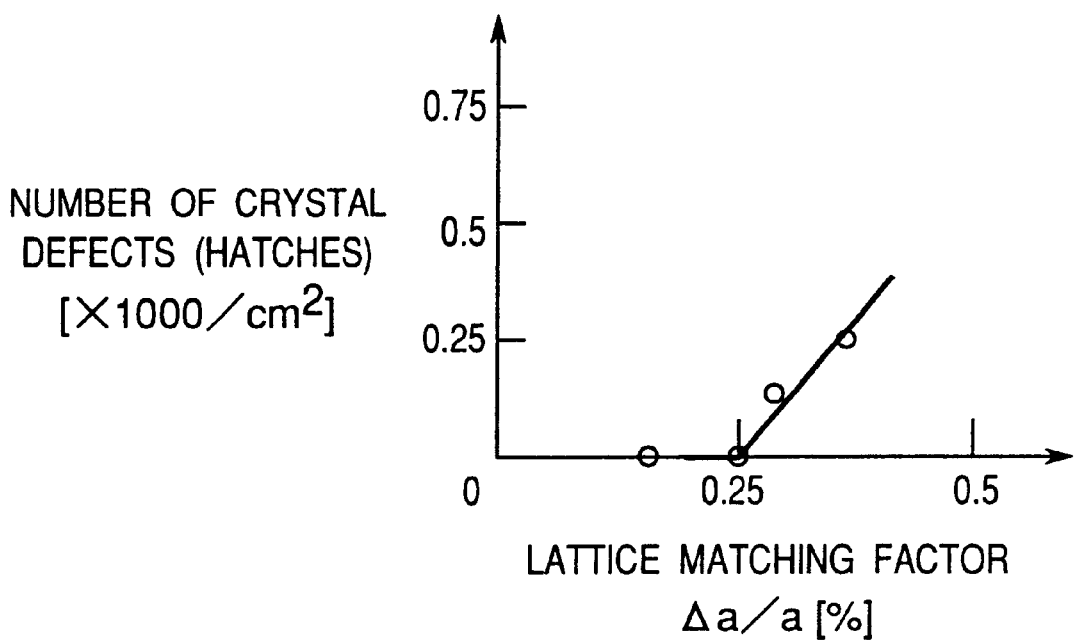
FIG. 31 is a graph showing the number of crystal defects with respect to the lattice matching factor.
Figure 32:
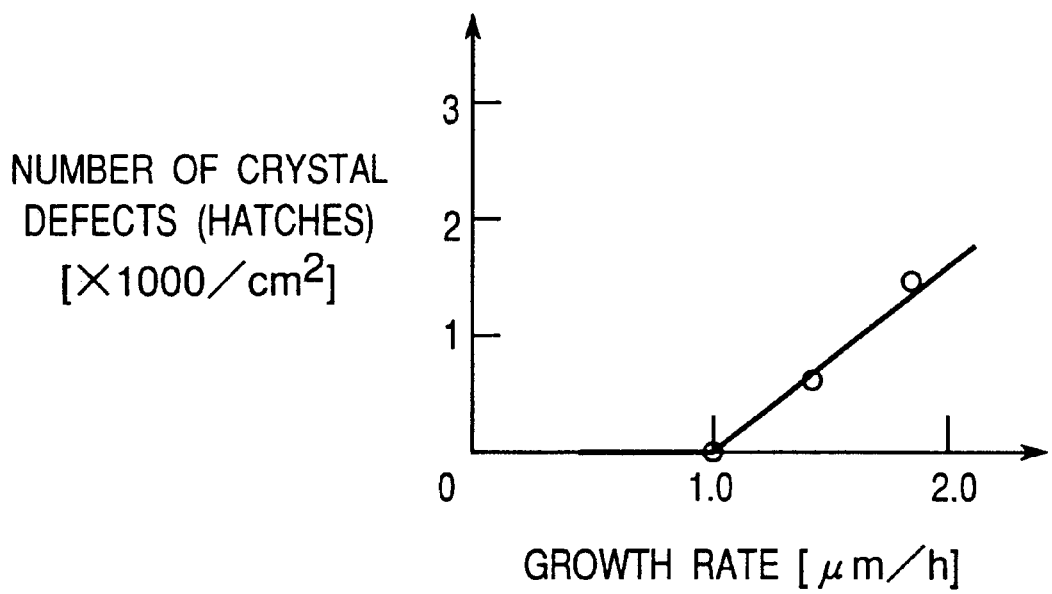
FIG. 32 is a graph showing the number of crystal defects with respect to the growth rate.

The present applicant has examined a relation between the lattice matching factor and the crystal defect through experiment and has discovered that the crystal defect (hatch) is generated when the absolute value of the lattice matching factor $\Delta a/a$ is not smaller than 0.25%, as shown in FIG. 31. As a result of examining a relation between the growth rate and the crystal defect, it has been discovered that the generation of crystal defects is reduced by making the growth rate not greater than 1.0 $\mu$m/h at the crystal interface having lattice mismatching caused by a great many crystal defects, as shown in FIG. 32. The experiment of FIG. 32 was conducted with a crystal laminate in which the absolute value of the lattice matching factor $\Delta a/a$ was 1.8%.

With the above arrangement, the crystal defects can be reduced by setting a growth rate of not greater than 1.0 $\mu$m/h at least in the initial stage of growth when growing a layer from an interface at which the lattice mismatching exists during the growth of a crystal having lattice mismatching (a condition in which a crystal defect occurs) of a lattice matching factor $\Delta a/a$ of which the absolute value is not smaller than 0.25%.

The method for producing a semiconductor light-emitting device of the present invention will be described in more detail below on the basis of the embodiments thereof with shown in the drawings.

First Embodiment

A method for producing a semiconductor light-emitting device or, for example, a light-emitting diode according to the first embodiment of the present invention will be described with reference to FIG. 1.

Figure 1:
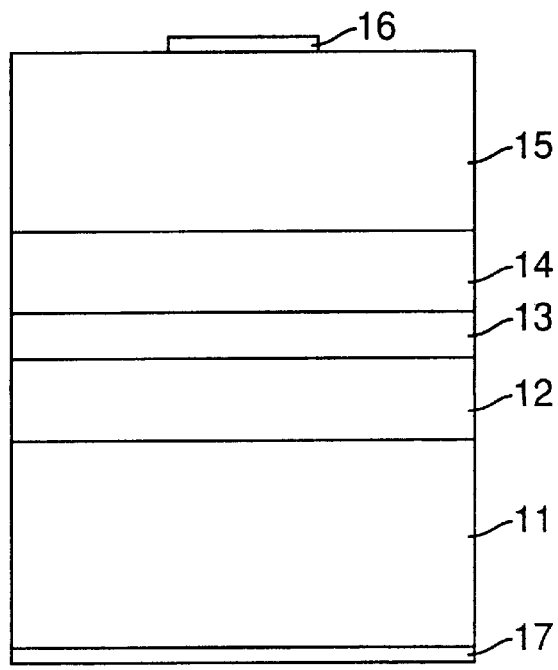
FIG. 1 is a sectional view of a semiconductor light-emitting device according to a first embodiment of the present invention.

As shown in FIG. 1, an n-type $(Al_xGa_{1-x})_{0.51}In_{0.49}P$ ($0\leq x\leq 1$) lower clad layer 12 (having the specifications of, for example, x=1.0, a Si carrier density of $5\times 10^{17}$ cm$^{-3}$ and a thickness of 1.0 $\mu$m), an $(Al_xGa_{1-x})_{0.51}In_{0.49}P$ ($0\leq x\leq 1$) active layer 13 (having the specifications of, for example, x=0.3 and a thickness of 0.5 $\mu$m) and a p-type $(Al_xGa_{1-x})_{0.51}In_{0.49}P$ ($0\leq x\leq 1$) upper clad layer 14 (having the specifications of, for example, x=1.0, a Zn carrier density of $5\times 10^{17}$ cm$^{-3}$ and a thickness of 1.0 $\mu$am) are made to successively grow on an n-type GaAs substrate 11 by the metal-organic chemical vapor deposition (MOCVD) method.

A p-type $(Al_xGa_{1-x})_yIn_{1-y}P$ ($0\leq x\leq 1$, $0\leq y\leq 1$) current diffusion layer 15 (having the specifications of, for example, x=0.0, y=1.0, a Zn carrier density of $5\times 10^{17}$ cm$^{-3}$ and a thickness of 7.0 $\mu$m) is made to grow on the above processed base. In this stage, the growth rate of the current diffusion layer 15 is set to 0.8 $\mu$m/h.

Next, a p-type electrode 16 (made of, for example, Au—Zn) and an n-type electrode 17 (made of, for example, Au—Ge) are formed by vapor deposition, and then the p-type electrode 16 is processed into, for example, a round shape, completing a light-emitting diode.

According to this first embodiment, a lattice mismatching of about −3.5% exists between the upper clad layer 14 and the current diffusion layer 15. According to the conventional light-emitting diode, the growth rate of the current diffusion layer has not been set not greater than 1 $\mu$m/h. Therefore, the current diffusion layer has had a degraded crystallinity as well as a degraded surface shape. In contrast to this, according to this first embodiment, the growth rate of the current diffusion layer 15 is set to 0.8 $\mu$m/h, which is not greater than 1 $\mu$m/h. Therefore, the crystallinity of the current diffusion layer 15 is better than that of the conventional light-emitting diode, and the surface shape is almost flat. Therefore, the current injected from the p-type electrode 16 diffuses better in the current diffusion layer 15, and the current diffusion layer 15 has good light transmittance. Since the adhesion of the p-type electrode 16 to be formed on the current diffusion layer 15 is good, a high-luminance high-productivity light-emitting diode capable of operating at a low voltage can be obtained, by comparison with the conventional light-emitting diode.

Second Embodiment

A method for producing a semiconductor light-emitting device or, for example, a light-emitting diode according to the second embodiment of the present invention will be described with reference to FIGS. 2 through 4.

Figure 2:
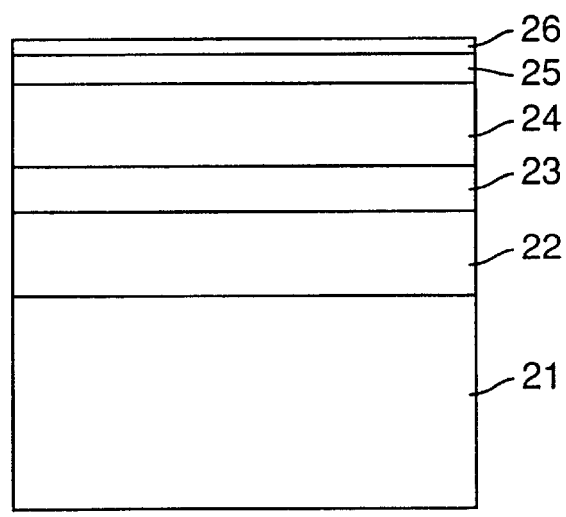
FIG. 2 is a sectional view showing a method for producing a semiconductor light-emitting device according to a second embodiment of the present invention.

As shown in FIG. 2, an n-type $(Al_xGa_{1-x})_{0.51}In_{0.49}P$ ($0\leq x\leq 1$) lower clad layer 22 (having the specifications of, for example, x=1.0, a Si carrier density of $5\times 10^{17}$ cm$^{-3}$ and a thickness of 1.0 $\mu$m), an $(Al_xGa_{1-x})_{0.51}In_{0.49}P$ ($0\leq x\leq 1$) active layer 23 (having the specifications of, for example, x=0.3 and a thickness of 0.5 $\mu$m), a p-type $(Al_xGa_{1-x})_{0.51}In_{0.49}P$ ($0\leq x\leq 1$) upper clad layer 24 (having the specifications of, for example, x=1.0, a Zn carrier density of $5\times 10^{17}$ cm$^{-3}$ and a thickness of 1.0 $\mu$m), a p-type $(Al_xGa_{1-x})_yIn_{1-y}P$ ($0\leq x\leq 1$, $0\leq y\leq 1$) first current diffusion layer 25 (having the specifications of, for example, x=0.0, y=1.0, a Zn carrier density of $3\times 10^{18}$ cm$^{-3}$ and a thickness of 1.5 $\mu$m) and an n-type $(Al_xGa_{1-x})_yIn_{1-y}P$ ($0\leq x\leq 1$, $0\leq y\leq 1$) current stopping layer 26 (having the specifications of, for example, x=0.0, y=1.0, a Si carrier density of $1\times 10^{18}$ cm$^{-3}$ and a thickness of 0.3 μm) are made to successively grow on an n-type GaAs substrate 21. In this stage, the growth rate of the first current diffusion layer 25 is set to 0.8 μm/h.

Figure 3:
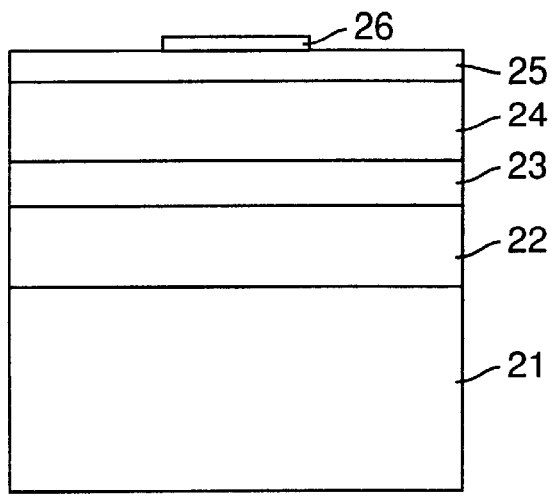
FIG. 3 is a sectional view showing the method for producing the above semiconductor light-emitting device, continued from FIG. 2.
Figure 4:
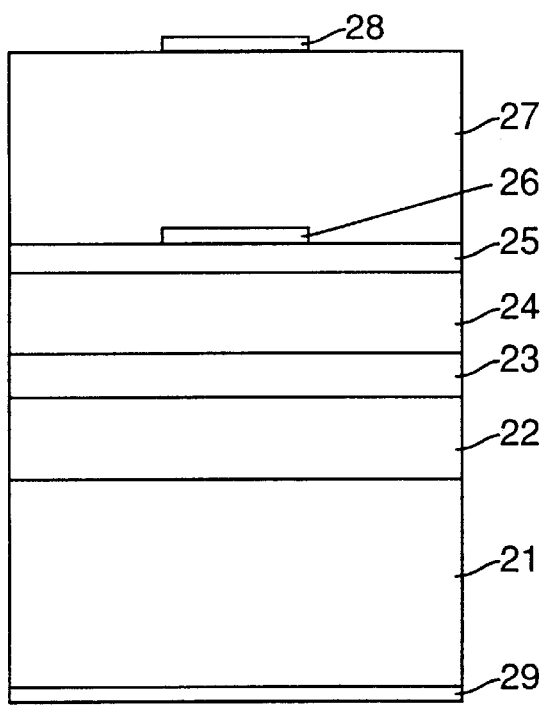
FIG. 4 is a sectional view showing the method for producing the above semiconductor light-emitting device, continued from FIG. 3.

Next, as shown in FIG. 3, the current stopping layer 26 is etched into, for example, a round shape by the normal photolithographic technique. Next, as shown in FIG. 4, a p-type $(Al_xGa_{1-x})_yIn_{1-y}P$ ($0 \leq x \leq 1$, $0 \leq y \leq 1$) second current diffusion layer 27 (having the specifications of, for example, x=0.0, y=1.0, a Zn carrier density of $3 \times 10^{18}$ cm$^{-3}$ and a thickness of 7.0 μm) is made to grow on the above processed base.

Next, a p-type electrode 28 (made of, for example, Au—Zn) and an n-type electrode 29 (made of, for example, Au—Ge) are formed by vapor deposition, and then the p-type electrode 28 is processed into, for example, a round shape, completing a light-emitting diode.

According to this second embodiment, a lattice mismatching of about −3.5% exists between the upper clad layer 24 and the first current diffusion layer 25. According to the conventional light-emitting diode, the growth rate of the current diffusion layer has not been set not greater than 1 μm/h. Therefore, the crystallinity of the current diffusion layer has been degraded, and the surface shape has also been degraded. In contrast to this, according to this second embodiment, the growth rate of the first current diffusion layer 25 is set to 0.8 μm/h, which is not greater than 1 μm/h. Therefore, the crystallinity of the first current diffusion layer 25, the current stopping layer 26 and the second current diffusion layer 27 is better than that of the conventional light-emitting diode, and the surface shape of the second current diffusion layer 27 is almost flat. Therefore, the current injected from the p-type electrode diffuses better in the current diffusion layers 25 and 27, and the current stopping layer 26 has a good effect of stopping the current. The current diffusion layers 25 and 27 have good light transmittance. Since the adhesion of the p-type electrode 28 formed on the current diffusion layer 27 is good, a high-luminance high-productivity light-emitting diode capable of operating at a low voltage can be obtained, by comparison with the conventional light-emitting diode.

Third Embodiment

A method for producing a semiconductor light-emitting device or, for example, a light-emitting diode according to the third embodiment of the present invention will be described with reference to FIG. 5.

Figure 5:
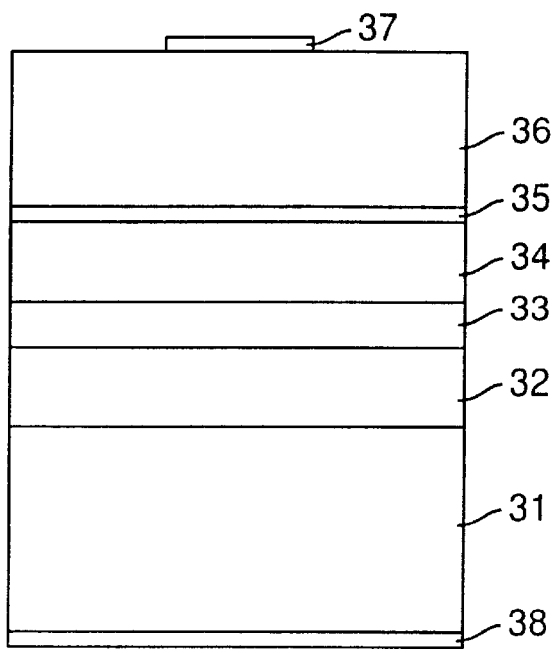
FIG. 5 is a sectional view of a semiconductor light-emitting device according to a third embodiment of the present invention.

As shown in FIG. 5, an n-type $(Al_xGa_{1-x})_{0.51}In_{0.49}P$ ($0 \leq x \leq 1$) lower clad layer 32 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 33 (having the specifications of, for example, x=0.3 and a thickness of 0.5 μm) and a p-type $(Al_xGa_{1-x})_{0.51}In_{0.49}P$ ($0 \leq x \leq 1$) upper clad layer 34 (having the specifications of, for example, x=1.0, a Zn carrier density of $5 \times 10^{17}$ cm$^{-3}$ and a thickness of 1.0 μm) are made to successively grow on an n-type GaAs substrate 31.

On the above processed base, a p-type $(Al_xGa_{1-x})_yIn_{1-y}P$ ($0 \leq x \leq 1$, $0 \leq y \leq 1$) intermediate layer 35 (having the specifications of, for example, x=0.2, y=1.0, a Zn carrier density of $3 \times 10^{18}$ cm$^{-3}$ and a thickness of 0.5 μm) and a p-type $(Al_xGa_{1-x})_yIn_{1-y}P$ ($0 \leq x \leq 1$, $0 \leq y \leq 1$) current diffusion layer 36 (having the specifications of, for example, x=0.0, y=1.0, a Zn carrier density of $3 \cdot 10^{18}$ cm$^{-3}$ and a thickness of 7.0 μm) are made to grow. In this stage, the growth rate of the intermediate layer 35 is set to 0.5 μm/h.

Next, a p-type electrode 37 (made of, for example, Au—Zn) and an n-type electrode 38 (made of, for example, Au—Ge) are formed by vapor deposition, and then the p-type electrode 37 is processed into, for example, a round shape, completing a light-emitting diode.

According to this third embodiment, the material of the intermediate layer 35 is selected so as to satisfy the condition that the conduction band lower end of the intermediate layer 35 is intermediate between the conduction band lower end of the upper clad layer 34 and the conduction band lower end of the current diffusion layer 36 and the condition that the valence band upper end of the intermediate layer 35 is intermediate between the valence band upper end of the upper clad layer 34 and the valence band upper end of the current diffusion layer 36. There is produced the effect of reducing the hetero barrier at the interface between the upper clad layer 34 and the current diffusion layer 36. However, a great lattice mismatching of about −3.4% exists between the upper clad layer 34 and the intermediate layer 35.

According to the conventional light-emitting diode, the growth rate of the intermediate layer has not been set not greater than 1 μm/h. Therefore, the crystallinity of the intermediate layer and the current diffusion layer formed on the intermediate layer has been degraded, and the surface shape has also been degraded. Furthermore, the lattice mismatching causes a great many interface state densities at the interface between the intermediate layer and the upper clad layer, as a consequence of which the band profile is warped.

However, according to this third embodiment, the growth rate of the intermediate layer 35 is set to 0.8 μm/h, which is not greater than 1 μm/h. Therefore, the crystallinity of the intermediate layer 35 and the current diffusion layer 36 is better than that of the conventional light-emitting diode, and the surface shape is almost flat. Also, the interface state densities at the interface between the intermediate layer 35 and the upper clad layer 34 are also sharply reduced. Therefore, the current injected from the p-type electrode 37 diffuses better in the current diffusion layer 36, and the light transmittance of the current diffusion layer 36 is improved. The adhesion of the p-type electrode 37 formed on the current diffusion layer 36 is also improved. By the sharp reduction of the interface state densities at the interface between the intermediate layer 35 and the upper clad layer 34, the warp of the band profile can be suppressed. By virtue of the aforementioned effects, a high-luminance high-productivity light-emitting diode capable of operating at a low voltage can be obtained according to the third embodiment, by comparison with the conventional light-emitting diode.

Fourth Embodiment

A method for producing a semiconductor light-emitting device or, for example, a light-emitting diode according to the fourth embodiment of the present invention will be described with reference to FIG. 6.

Figure 6:
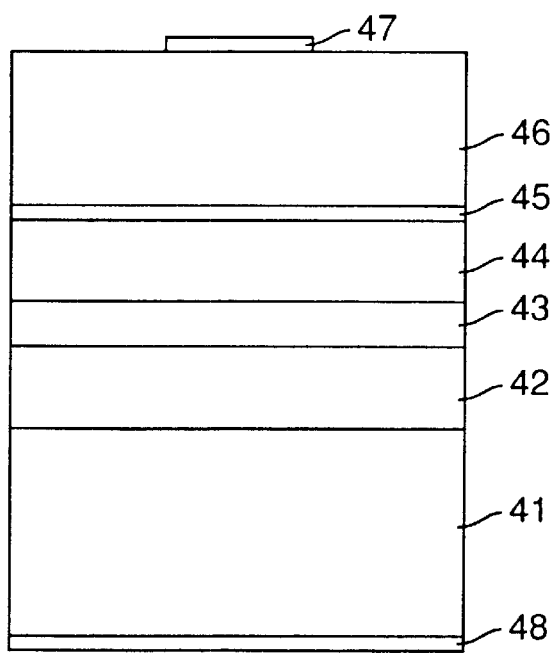
FIG. 6 is a sectional view of a semiconductor light-emitting device according to a fourth embodiment of the present invention.

As shown in FIG. 6, an n-type $(Al_xGa_{1-x})_{0.51}In_{0.49}P$ ($0 \leq x \leq 1$) lower clad layer 42 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 43 (having the specifications of, for example, x=0.3 and a thickness of 0.5 μm) and a p-type $(Al_xGa_{1-x})_{0.51}In_{0.49}P$ ($0 \leq x \leq 1$) upper clad layer 44 (having the specifications of, for example, x=1.0, a Zn carrier density of $5 \times 10^{17}$ cm$^{-3}$ and a thickness of 1.0 μm) are made to successively grow on an n-type GaAs substrate 41.

On the above processed base, a p-type $(Al_xGa_{1-x})_{0.51}In_{0.49}P$ ($0 \leq x \leq 1$) intermediate layer 45 (having the specifications of, for example, x=0.5, a Zn carrier density of $3 \times 10^{18}$ cm$^{-3}$ and a thickness of 0.5 μm) and a p-type $(Al_xGa_{1-x})_yIn_{1-y}P$ ($0 \leq x \leq 1$, $0 \leq y \leq 1$) current diffusion layer 46 (having the specifications of, for example, x=0.0, y=1.0, a Zn carrier density of $3 \times 10^{18}$ cm$^{-3}$ and a thickness of 7.0 μm) are made to grow. In this stage, the growth rate of the current diffusion layer 46 is set to 0.8 μm/h.

Next, a p-type electrode 47 (made of, for example, Au—Zn) and an n-type electrode 48 (made of, for example, Au—Ge) are formed by vapor deposition, and then the p-type electrode 47 is processed into, for example, a round shape, completing a light-emitting diode.

According to this fourth embodiment, the material of the intermediate layer 45 is selected so as to satisfy the condition that the valence band upper end of the intermediate layer 45 is intermediate between the valence band upper end of the upper clad layer 44 and the valence band upper end of the current diffusion layer 46. There is produced the effect of reducing the hetero barrier at the interface between the upper clad layer and the current diffusion layer. However, a great lattice mismatching of about −3.5% exists between the intermediate layer 45 and the current diffusion layer 46.

According to the conventional light-emitting diode, the growth rate of the current diffusion layer has not been set not greater than 1 μm/h. Therefore, the crystallinity of the current diffusion layer has been degraded, and the surface shape has also been degraded. Furthermore, the lattice mismatching causes a great many interface state densities at the interface between the intermediate layer and the current diffusion layer, as a consequence of which the band profile is warped.

However, according to this fourth embodiment, the growth rate of the current diffusion layer 46 is set to 0.8 μm/h, which is not greater than 1 μm/h. Therefore, the crystallinity of the current diffusion layer 46 is better than that of the conventional light-emitting diode, and the surface shape is almost flat. Also, the interface state densities at the interface between the intermediate layer 45 and the current diffusion layer 46 are also sharply reduced. With this arrangement, the current injected from the p-type electrode 47 diffuses better in the current diffusion layer 46, and the light transmittance of the current diffusion layer 46 is improved. The adhesion of the p-type electrode 47 formed on the current diffusion layer 46 is also improved. By the sharp reduction of the interface state densities at the interface between the intermediate layer 45 and the current diffusion layer 46, the warp of the band profile can be suppressed. By virtue of the aforementioned effects, a high-luminance high-productivity light-emitting diode capable of operating at a low voltage can be obtained according to the fourth embodiment, by comparison with the conventional light-emitting diode.

Fifth Embodiment

A method for producing a semiconductor light-emitting device or, for example, a light-emitting diode according to the fifth embodiment of the present invention will be described with reference to FIG. 7.

Figure 7:
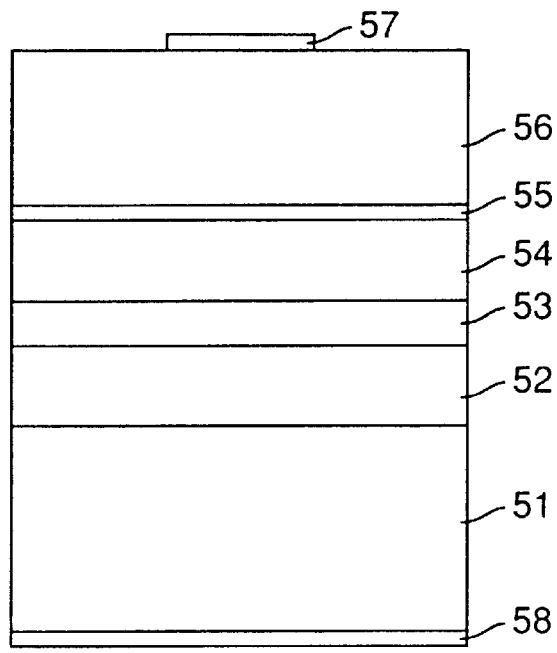
FIG. 7 is a sectional view of a semiconductor light-emitting device according to a fifth embodiment of the present invention.

As shown in FIG. 7, an n-type $(Al_xGa_{1-x})_{0.51}In_{0.49}P$ ($0 \leq x \leq 1$) lower clad layer 52 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 53 (having the specifications of, for example, x=0.3 and a thickness of 0.5 μm) and a p-type $(Al_xGa_{1-x})_{0.51}In_{0.49}P$ ($0 \leq x \leq 1$) upper clad layer 54 (having the specifications of, for example, x=1.0, a Zn carrier density of $5 \times 10^{17}$ cm$^{-3}$ and a thickness of 1.0 μm) are made to successively grow on an n-type GaAs substrate 51.

On the above processed base, a p-type $Al_xIn_{1-x}As$ ($0 \leq x \leq 1$) intermediate layer 55 (having the specifications of, for example, x=0.8, a Zn carrier density of $3 \times 10^{18}$ cm$^{-3}$ and a thickness of 0.1 μm) and a p-type $(Al_xGa_{1-x})_yIn_{1-y}P$ ($0 \leq x \leq 1$, $0 \leq y \leq 1$) current diffusion layer 56 (having the specifications of, for example, x=0.0, y=1.0, a Zn carrier density of $3 \times 10^{18}$ cm$^{-3}$ and a thickness of 7.0 μm) are made to grow. In this stage, the growth rate of the intermediate layer 55 is set to 0.5 μm/h, and the growth rate of the current diffusion layer 56 is set to 0.8 μm/h.

Next, a p-type electrode 57 (made of, for example, Au—Zn) and an n-type electrode 58 (made of, for example, Au—Ge) are formed by vapor deposition, and then the p-type electrode 57 is processed into, for example, a round shape, completing a light-emitting diode.

According to this fifth embodiment, the material of the intermediate layer 55 is selected so as to satisfy the condition that the conduction band lower end of the intermediate layer 55 is intermediate between the conduction band lower end of the upper clad layer 54 and the conduction band lower end of the current diffusion layer 56 and the condition that the valence band upper end of the intermediate layer 55 is intermediate between the valence band upper end of the upper clad layer 54 and the valence band upper end of the current diffusion layer 56. There is produced the effect of reducing the hetero barrier at the interface between the upper clad layer and the current diffusion layer. However, a great lattice mismatching of about 2.3% exists between the upper clad layer 54 and the intermediate layer 55, and a great lattice mismatching of about −5.7% exists between the intermediate layer 55 and the current diffusion layer 56.

According to the conventional light-emitting diode, the growth rates of the intermediate layer and the current diffusion layer have not each been set not greater than 1 μm/h. Therefore, the crystallinity of the intermediate layer and the current diffusion layer has been degraded, and the surface shape has also been degraded. Furthermore, the lattice mismatching causes a great many interface state densities at the interface between the intermediate layer and the upper clad layer and the interface between the intermediate layer and the current diffusion layer, as a consequence of which the band profile is warped.

However, according to this fifth embodiment, the growth rate of the intermediate layer 55 is set to 0.5 μm/h and the growth rate of the current diffusion layer 56 is set to 0.8 μm/h, the values each being not greater than 1 μm/h. Therefore, the crystallinity of the intermediate layer 55 and the current diffusion layer 56 is better than that of the conventional light-emitting diode, and the surface shape is almost flat. The interface state densities at the interface between the intermediate layer 55 and the upper clad layer 54 and the interface between the intermediate layer 55 and the current diffusion layer 56 are also sharply reduced. With this arrangement, the current injected from the p-type electrode 57 diffuses better in the current diffusion layer 56, and the light transmittance of the current diffusion layer 56 is improved. The adhesion of the p-type electrode 57 formed on the current diffusion layer 56 is also improved. By the sharp reduction of the interface state densities at the interface between the intermediate layer 55 and the upper clad layer 54 and the interface between the intermediate layer 55 and the current diffusion layer 56, the warp of the band profile can be suppressed. By virtue of the aforementioned effects, a high-luminance high-productivity light-emitting diode capable of operating at a low voltage can be obtained according to the fifth embodiment, by comparison with the conventional light-emitting diode.

Sixth Embodiment

A method for producing a semiconductor light-emitting device or, for example, a light-emitting diode according to the sixth embodiment of the present invention will be described with reference to FIG. 8.

Figure 8:
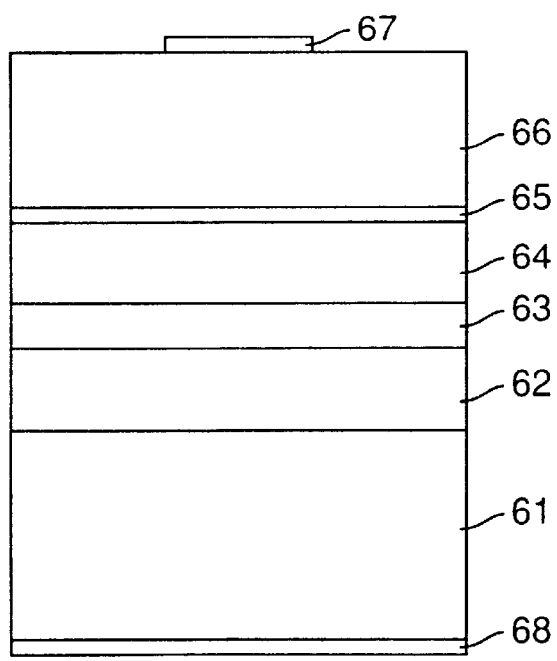
FIG. 8 is a sectional view of a semiconductor light-emitting device according to a sixth embodiment of the present invention.

As shown in FIG. 8, an n-type $(Al_xGa_{1-x})_{0.51}In_{0.49}P$ ($0 \leq x \leq 1$) lower clad layer 62 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 63 (having the specifications of, for example, x=0.3 and a thickness of 0.5 μm) and a p-type $(Al_xGa_{1-x})_{0.51}In_{0.49}P$ ($0 \leq X \leq 1$) upper clad layer 64 (having the specifications of, for example, x=1.0, a Zn carrier density of $5 \times 10^{17}$ cm$^{-3}$ and a thickness of 1.0 μm) are made to successively grow on an n-type GaAs substrate 61.

On the above processed base, a p-type $(Al_xGa_{1-x})_yIn_{1-y}P$ ($0 \leq x \leq 1$, $0 \leq y \leq 1$) intermediate layer 65 (having the specifications of, for example, x=1.0, y=0.75, a Zn carrier density of $3 \times 10^{18}$ cm$^{-3}$ and a thickness of 0.5 μm) and a p-type $(Al_xGa_{1-x})_yIn_{1-y}P$ ($0 \leq x \leq 1$, $0 \leq y \leq 1$) current diffusion layer 66 (having the specifications of, for example, x=0.0, y=1.0, a Zn carrier density of $3 \times 10^{18}$ cm$^{-3}$ and a thickness of 7.0 μm) are made to grow. In this stage, the growth rate of the intermediate layer 65 is set to 0.5 μm/h.

Next, a p-type electrode 67 (made of, for example, Au—Zn) and an n-type electrode 68 (made of, for example, Au—Ge) are formed by vapor deposition and then the p-type electrode 67 is processed into, for example, a round shape, completing a light-emitting diode.

According to this sixth embodiment, the material of the intermediate layer 65 is selected so as to satisfy the condition that the lattice constant of the intermediate layer 65 is intermediate between the lattice constant of the upper clad layer 64 and the lattice constant of the current diffusion layer 66. There are produced the effect of alleviating the lattice mismatching at the interface between the upper clad layer and the current diffusion layer as well as the effect of reducing the hetero barrier by the reduction of the interface state densities. However, a great lattice mismatching of about −1.8% exists between the upper clad layer 64 and the intermediate layer 65.

According to the conventional light-emitting diode, the growth rate of the intermediate layer has not been set not greater than 1 μm/h. Therefore, the crystallinity of the intermediate layer and the current diffusion layer grown on the intermediate layer has been degraded, and the surface shape has also been degraded. Furthermore, the lattice mismatching causes a great many interface state densities at the interface between the intermediate layer and the upper clad layer, as a consequence of which the band profile is warped.

However, according to this sixth embodiment, the growth rate of the intermediate layer 65 is set to 0.5 μm/h, which is not greater than 1 μm/h. Therefore, the crystallinity of the intermediate layer 65 and the current diffusion layer 66 is better than that of the conventional light-emitting diode, and the surface shape is almost flat. The interface state densities at the interface between the intermediate layer 65 and the upper clad layer 64 are also sharply reduced. With this arrangement, the current injected from the p-type electrode 67 diffuses better in the current diffusion layer 66, and the light transmittance of the current diffusion layer 66 is improved. The adhesion of the p-type electrode 67 formed on the current diffusion layer 66 is also improved. By the sharp reduction of the interface state densities at the interface between the intermediate layer 65 and the upper clad layer 64, the warp of the band profile can be suppressed. By virtue of the aforementioned effects, a high-luminance high-productivity light-emitting diode capable of operating at a low voltage can be obtained according to the sixth embodiment, by comparison with the conventional light-emitting diode.

Seventh Embodiment

A method for producing a semiconductor light-emitting device or, for example, a light-emitting diode according to the seventh embodiment of the present invention will be described with reference to FIG. 9.

Figure 9:
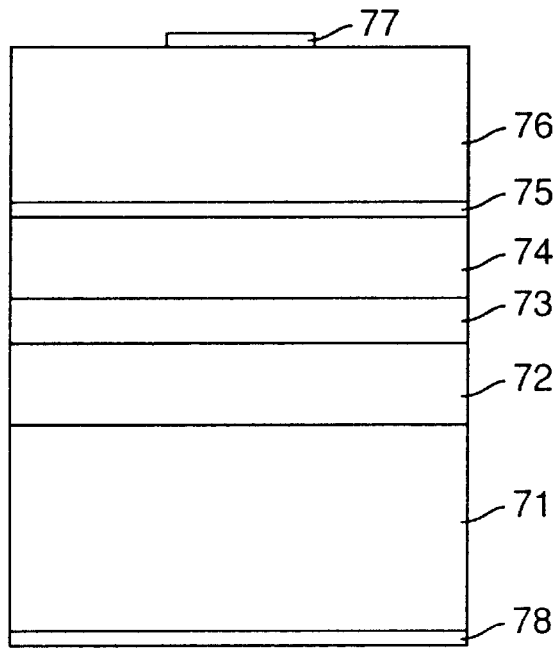
FIG. 9 is a sectional view of a semiconductor light-emitting device according to a seventh embodiment of the present invention.

As shown in FIG. 9, an n-type $(Al_xGa_{1-x})_{0.51}In_{0.49}P$ ($0 \leq x \leq 1$) lower clad layer 72 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 73 (having the specifications of, for example, x=0.3 and a thickness of 0.5 μm) and a p-type $(Al_xGa_{1-x})_{0.51}In_{0.49}P$ ($0 \leq x \leq 1$) upper clad layer 74 (having the specifications of, for example, x=1.0, a Zn carrier density of $3 \times 10^{17}$ cm$^{-3}$ and a thickness of 1.0 μm) are made to successively grow on an n-type GaAs substrate 71.

On the above processed base, a p-type $(Al_xGa_{1-x})_yIn_{1-y}P$ ($0 \leq x \leq 1$, $0 \leq y \leq 1$) intermediate layer 75 (having the specifications of, for example, x=1.0, y=0.75, a Zn carrier density of $3 \times 10^{18}$ cm$^{-3}$ and a thickness of 0.5 μm) and a p-type $(Al_xGa_{1-x})_yIn_{1-y}P$ ($0 \leq x \leq 1$, $0 \leq y \leq 1$) current diffusion layer 76 (having the specifications of, for example, x=0.0, y=1.0, a Zn carrier density of $3 \times 10^{18}$ cm$^{-3}$ and a thickness of 7.0 μm) are made to grow. In this stage, the growth rate of the current diffusion layer 76 is set to 0.8 μm/h.

Next, a p-type electrode 77 (made of, for example, Au—Zn) and an n-type electrode 78 (made of, for example, Au—Ge) are formed by vapor deposition, and then the p-type electrode 77 is processed into, for example, a round shape, completing a light-emitting diode.

According to this seventh embodiment, the material of the intermediate layer 75 is selected so as to satisfy the condition that the lattice constant of the intermediate layer 75 is intermediate between the lattice constant of the upper clad layer 74 and the lattice constant of the current diffusion layer 76. There are produced the effect of alleviating the lattice mismatching at the interface between the upper clad layer and the current diffusion layer and the effect of reducing the hetero barrier by the reduction of the interface state densities. However, a great lattice mismatching of about −1.8% exists between the intermediate layer 75 and the current diffusion layer 76.

According to the conventional light-emitting diode, the growth rate of the intermediate layer has not been set not greater than 1 μm/h. Therefore, the crystallinity of the intermediate layer and the current diffusion layer grown on the intermediate layer has been degraded, and the surface shape has also been degraded. Furthermore, the lattice mismatching causes a great many interface state densities at the interface between the intermediate layer and the current diffusion layer, as a consequence of which the band profile is warped.

However, according to this seventh embodiment, the growth rate of the current diffusion layer 76 is set to 0.8

$\mu$m/h, which is not greater than 1 $\mu$m/h. Therefore, the crystallinity of the current diffusion layer 76 is better than that of the conventional light-emitting diode, and the surface shape is almost flat. The interface state densities at the interface between the intermediate layer 75 and the current diffusion layer 76 are also sharply reduced. With this arrangement, the current injected from the p-type electrode 77 diffuses better in the current diffusion layer 76, and the light transmittance of the current diffusion layer 76 is improved. Furthermore, the adhesion of the p-type electrode 77 formed on the current diffusion layer 76 is also improved. By the sharp reduction of interface state densities at the interface between the intermediate layer 75 and the current diffusion layer 76, the warp of the band profile can be suppressed. By virtue of the aforementioned effects, a high-luminance high-productivity light-emitting diode capable of operating at a low voltage can be obtained according to the seventh embodiment, by comparison with the conventional light-emitting diode.

Eighth Embodiment

A method for producing a semiconductor light-emitting device or, for example, a light-emitting diode according to the eighth embodiment of the present invention will be described with reference to FIG. 10.

Figure 10:
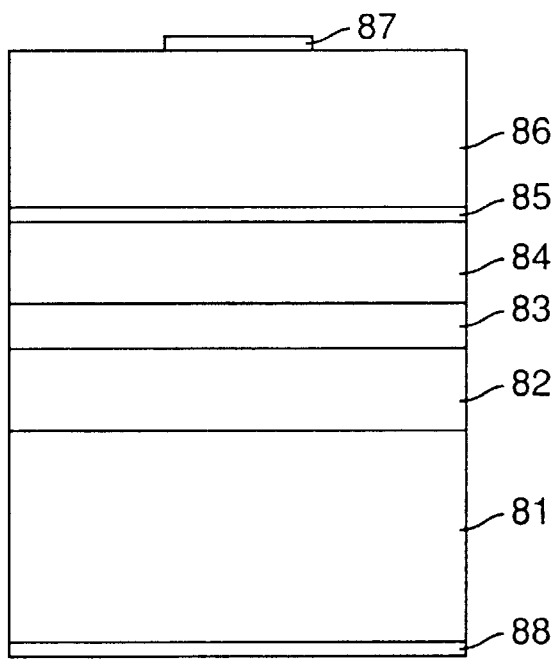
FIG. 10 is a sectional view of a semiconductor light-emitting device according to an eighth embodiment of the present invention.

As shown in FIG. 10, an n-type $(Al_xGa_{1-x})_{0.51}In_{0.49}P$ ($0 \leq x \leq 1$) lower clad layer 82 (having the specifications of, for example, x=1.0, a Si carrier density of $5 \times 10^{17}$ cm$^{-3}$ and a thickness of 1.0 $\mu$m), an $(Al_xGa_{1-x})_{0.51}In_{0.49}P$ ($0 \leq x \leq 1$) active layer 83 (having the specifications of, for example, x=0.3 and a thickness of 0.5 $\mu$m) and a p-type $(Al_xGa_{1-x})_{0.51}In_{0.49}P$ ($0 \leq x \leq 1$) upper clad layer 84 (having the specifications of, for example, x=1.0, a Zn carrier density of $5 \times 10^{17}$ cm$^{-3}$ and a thickness of 1.0 $\mu$m) are made to successively grow on an n-type GaAs substrate 81.

On the above processed base, a p-type $(Al_xGa_{1-x})_yIn_{1-y}P$ ($0 \leq x \leq 1$, $0 \leq y \leq 1$) intermediate layer 85 (having the specifications of, for example, x=1.0, y=0.75, a Zn carrier density of $3 \times 10^{18}$ cm$^{-3}$ and a thickness of 0.5 $\mu$m) and a p-type $(Al_xGa_{1-x})_yIn_{1-y}P$ ($0 \leq x \leq 1$, $0 \leq y \leq 1$) current diffusion layer 86 (having the specifications of, for example, x=0.0, y=1.0, a Zn carrier density of $3 \times 10^{18}$ cm$^{-3}$ and a thickness of 7.0 $\mu$m) are made to grow. In this stage, the growth rate of the intermediate layer 85 is set to 0.5 $\mu$m/h, and the growth rate of the current diffusion layer 86 is set to 0.8 $\mu$m/h.

Next, a p-type electrode 87 (made of, for example, Au—Zn) and an n-type electrode 88 (made of, for example, Au—Ge) are formed by vapor deposition, and then the p-type electrode 87 is processed into, for example, a round shape, completing a light-emitting diode.

According to this eighth embodiment, the material of the intermediate layer 85 is selected so as to satisfy the condition that the lattice constant of the intermediate layer 85 is intermediate between the lattice constant of the upper clad layer 84 and the lattice constant of the current diffusion layer 86. There are produced the effect of alleviating the lattice mismatching at the interface between the upper clad layer 84 and the current diffusion layer 86 as well as the effect of reducing the hetero barrier by the reduction of the interface state densities. However, a great lattice mismatching of about −1.8% exists between the upper clad layer 84 and the intermediate layer 85, and a great lattice mismatching of about −1.8% exists between the intermediate layer 85 and the current diffusion layer 86.

According to the conventional light-emitting diode, the growth rates of the intermediate layer and the current diffusion layer have not each been set not greater than 1 $\mu$m/h. Therefore, the crystallinity of the intermediate layer and the current diffusion layer grown on the intermediate layer has been degraded, and the surface shape has also been degraded. Furthermore, the lattice mismatching causes a great many interface state densities at the interface between the upper clad layer and the intermediate layer and the interface between the intermediate layer and the current diffusion layer, as a consequence of which the band profile is warped.

However, according to this eighth embodiment, the growth rate of the intermediate layer 85 is set to 0.5 $\mu$m/h, and the growth rate of the current diffusion layer 85 is set to 0.8 $\mu$m/h, the values each being not greater than 1 $\mu$m/h. Therefore, the crystallinity of the current diffusion layer 86 is better than that of the conventional light-emitting diode, and the surface shape is almost flat. The interface state densities at the interface between the upper clad layer 84 and the intermediate layer 85 and the interface between the intermediate layer 85 and the current diffusion layer 86 are also sharply reduced. With this arrangement, the current injected from the p-type electrode 87 diffuses better in the current diffusion layer 86, and the light transmittance of the current diffusion layer 86 is improved. Furthermore, the adhesion of the p-type electrode 87 formed on the current diffusion layer 86 is also improved. By the sharp reduction of the interface state densities at the interface between the upper clad layer 84 and the intermediate layer 85 and the interface between the intermediate layer 85 and the current diffusion layer 86, the warp of the band profile can be suppressed. By virtue of the aforementioned effects, a high-luminance high-productivity light-emitting diode capable of operating at a low voltage can be obtained according to the eighth embodiment, by comparison with the conventional light-emitting diode.

Ninth Embodiment

A method for producing a semiconductor light-emitting device or, for example, a light-emitting diode according to the ninth embodiment of the present invention will be described with reference to FIGS. 11 through 13.

Figure 11:
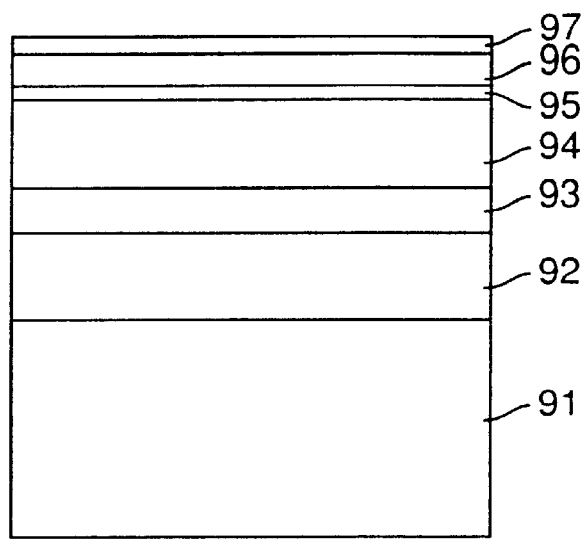
FIG. 11 is a sectional view of a semiconductor light-emitting device according to a ninth embodiment of the present invention.

As shown in FIG. 11, an n-type $(Al_xGa_{1-x})_{0.51}In_{0.49}P$ ($0 \leq x \leq 1$) lower clad layer 92 (having the specifications of, for example, x=1.0, a Si carrier density of $5 \times 10^{17}$ cm$^{-3}$ and a thickness of 1.0 $\mu$m), an $(Al_xGa_{1-x})_{0.51}In_{0.49}P$ ($0 \leq x \leq 1$) active layer 93 (having the specifications of, for example, x=0.3 and a thickness of 0.5 $\mu$m), a p-type $(Al_xGa_{1-x})_{0.51}In_{0.49}P$ ($0 \leq x \leq 1$) upper clad layer 94 (having the specifications of, for example, x=1.0, a Zn carrier density of $5 \times 10^{17}$ cm$^{-3}$ and a thickness of 1.0 $\mu$m), a p-type $(Al_xGa_{1-x})_yIn_{1-y}P$ ($0 \leq x \leq 1$, $0 \leq y \leq 1$) intermediate layer 95 (having the specifications of, for example, x=0.2, y=0.75, a Zn carrier density of $3 \times 10^{18}$ cm$^{-3}$ and a thickness of 0.5 $\mu$m), a p-type $(Al_xGa_{1-x})_yIn_{1-y}P$ ($0 \leq x \leq 1$, $0 \leq y \leq 1$) first current diffusion layer 96 (having the specifications of, for example, x=0.0, y=1.0, a Zn carrier density of $3 \times 10^{18}$ cm$^{-3}$ and a thickness of 1.5 $\mu$m) and an n-type $(Al_xGa_{1-x})_yIn_{1-y}P$ ($0 \leq x \leq 1$, $0 \leq y \leq 1$) current stopping layer 97 (having the specifications of, for example, x=0.0, y=1.0, a Si carrier density of $1 \times 10^{18}$ cm$^{-3}$ and a thickness of 0.3 $\mu$m) are made to successively grow on an n-type GaAs substrate 91. In this stage, the growth rate of the intermediate layer 95 is set to 0.5 $\mu$m/h, and the growth rate of the first current diffusion layer 96 is set to 0.8 $\mu$m/h.

Figure 12:
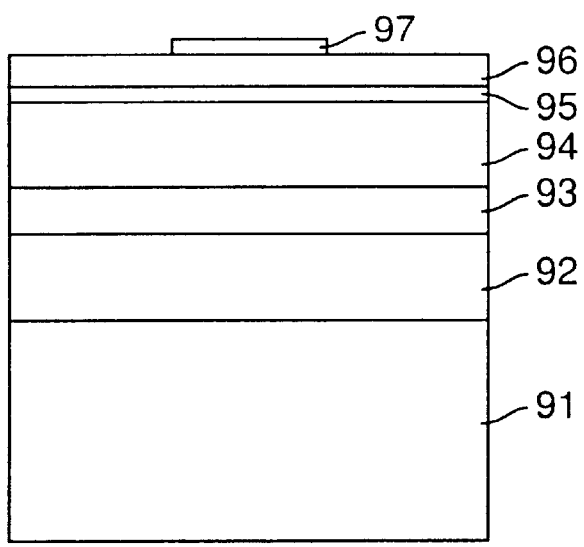
FIG. 12 is a sectional view of the above semiconductor light-emitting device continued from FIG. 11.

Next, as shown in FIG. 12, the current stopping layer 97 is etched into, for example, a round shape by the normal photolithographic technique.

Figure 13:
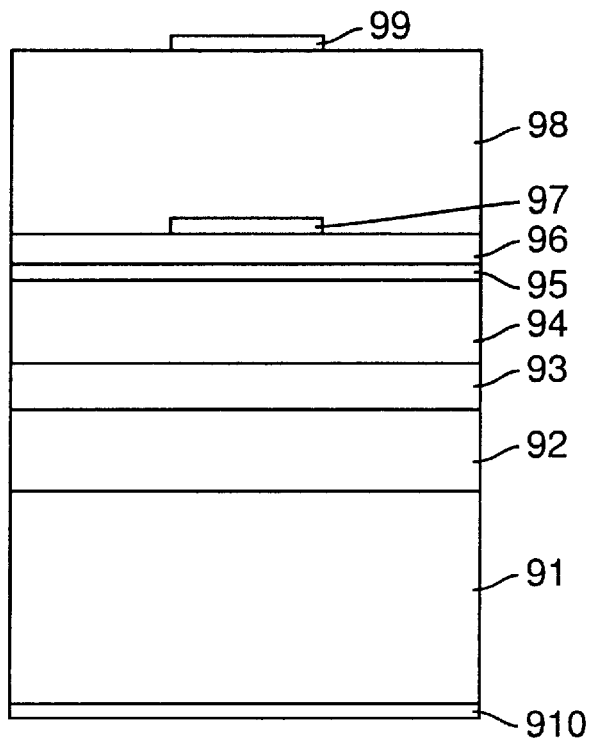
FIG. 13 is a sectional view of the above semiconductor light-emitting device, continued from FIG. 12.

Next, as shown in FIG. 13, a p-type $(Al_xGa_{1-x})_yIn_{1-y}P$ ($0 \leq x \leq 1$, $0 \leq y \leq 1$) second current diffusion layer 98 (having the specifications of, for example, x=0.0, y=1.0, a Zn carrier density of $3 \times 10^{18}$ cm$^{-3}$ and a thickness of 7.0 µm) is made to grow on the above processed base.

Next, a p-type electrode 99 (made of, for example, Au—Zn) and an n-type electrode 910 (made of, for example, Au—Ge) are formed by vapor deposition, and then the p-type electrode 99 is processed into, for example, a round shape, completing a light-emitting diode.

According to this ninth embodiment, the material of the intermediate layer 95 is selected so as to satisfy the condition that the lattice constant of the intermediate layer 95 is intermediate between the lattice constant of the upper clad layer 94 and the lattice constant of the first current diffusion layer 96, the condition that the conduction band lower end of the intermediate layer 95 is intermediate between the conduction band lower end of the upper clad layer 94 and the conduction band lower end of the first current diffusion layer 96 and the condition that the valence band upper end of the intermediate layer 95 is intermediate between the valence band upper end of the upper clad layer 94 and the valence band upper end of the first current diffusion layer 96. There is produced the effect of reducing the hetero barrier at the interface between the upper clad layer 94 and the first current diffusion layer 96. However, a great lattice mismatching of about −1.8% exists between the upper clad layer 94 and the intermediate layer 95 and between the intermediate layer 95 and the first current diffusion layer 96.

According to the conventional light-emitting diode, the growth rates of the intermediate layer and the first current diffusion layer have not each been set not greater than 1 µm/h. Therefore, the crystallinity of the intermediate layer and the current diffusion layer grown on the intermediate layer and the current stopping layer has been degraded, and the surface shape has also been degraded. Furthermore, the lattice mismatching causes a great many interface state densities at the interface between the upper clad layer and the intermediate layer and the interface between the intermediate layer and the first current diffusion layer, as a consequence of which the band profile is warped.

However, according to this ninth embodiment, the growth rate of the intermediate layer 95 is set to 0.5 µm/h, and the growth rate of the first current diffusion layer 96 is set to 0.8 µm/h, the values each being not greater than 1 µm/h. Therefore, the second current diffusion layer 98 has a better crystallinity than the conventional light-emitting diode, and the surface shape is almost flat. The interface state densities at the interface between the upper clad layer 94 and the intermediate layer 95 and the interface between the intermediate layer 95 and the first current diffusion layer 96 are also sharply reduced. With this arrangement, the current injected from the p-type electrode 97 diffuses better in the second current diffusion layer 98, and the current stopping layer 97 has an improved current stopping effect, for the improvement of the light transmittance of the second current diffusion layer 98. The adhesion of the p-type electrode 99 formed on the second current diffusion layer 98 is also improved. By the sharp reduction of the interface state densities at the interface between the upper clad layer 94 and the intermediate layer 95 and the interface between the intermediate layer 95 and the first current diffusion layer 96, the warp of the band profile can be suppressed. By virtue of the aforementioned effects, a high-luminance high-productivity light-emitting diode capable of operating at a low voltage can be obtained according to the ninth embodiment, by comparison with the conventional light-emitting diode.

Tenth Embodiment

A method for producing a semiconductor light-emitting device or, for example, a light-emitting diode according to the tenth embodiment of the present invention will be described with reference to FIGS. 14 through 16.

Figure 14:
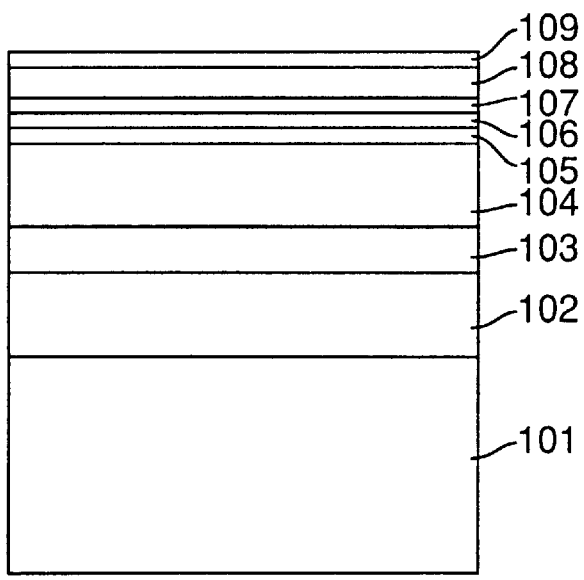
FIG. 14 is a sectional view of a semiconductor light-emitting device according to a tenth embodiment of the present invention.

As shown in FIG. 14, an n-type $(Al_xGa_{1-x})_{0.51}In_{0.49}P$ ($0 \leq x \leq 1$) lower clad layer 102 (having the specifications of, for example, x=1.0, a Si carrier density of $5 \times 10^{17}$ cm$^{-3}$ and a thickness of 1.0 µm), an $(Al_xGa_{1-x})_{0.51}In_{0.49}P$ ($0 \leq x \leq 1$) active layer 103 (having the specifications of, for example, x=0.3 and a thickness of 0.5 µm), a p-type $(Al_xGa_{1-x})_{0.51}In_{0.49}P$ ($0 \leq x \leq 1$) upper clad layer 104 (having the specifications of, for example, x=1.0, a Zn carrier density of $5 \times 10^{17}$ cm$^{-3}$ and a thickness of 1.0 µm), a p-type $(Al_xGa_{1-x})_yIn_{1-y}P$ ($0 \leq x \leq 1$, $0 \leq y \leq 1$) first intermediate layer 105 (having the specifications of, for example, x=0.8, y=0.75, a Zn carrier density of $3 \times 10^{18}$ cm$^{-3}$ and a thickness of 0.5 µm), a p-type $(Al_xGa_{1-x})_yIn_{1-y}P$ ($0 \leq x \leq 1$, $0 \leq y \leq 1$) second intermediate layer 106 (having the specifications of, for example, x=0.6, y=0.75, a Zn carrier density of $3 \times 10^{18}$ cm$^{-3}$ and a thickness of 1.5 µm), a p-type $(Al_xGa_{1-x})_yIn_{1-y}P$ ($0 \leq x \leq 1$, $0 \leq y \leq 1$) third intermediate layer 107 (having the specifications of, for example, x=0.4, y=0.75, a Zn carrier density of $1 \times 10^{18}$ cm$^{-3}$ and a thickness of 0.5 µm), a p-type $(Al_xGa_{1-x})_yIn_{1-y}P$ ($0 \leq x \leq 1$, $0 \leq y \leq 1$) first current diffusion layer 108 (having the specifications of, for example, x=0.0, y=1.0, a Zn carrier density of $3 \times 10^{18}$ cm$^{-3}$ and a thickness of 1.5 µm) and an n-type $(Al_xGa_{1-x})_yIn_{1-y}P$ ($0 \leq x \leq 1$, $0 \leq y \leq 1$) current stopping layer 109 (having the specifications of, for example, x=0.0, y=1.0, a Si carrier density of $1 \times 10^{18}$ cm$^{-3}$ and a thickness of 0.3 µm) are made to successively grow on an n-type GaAs substrate 101. In this stage, the growth rate of the first intermediate layer 105 is set to 0.5 µm/h, and the growth rate of the first current diffusion layer 108 is set to 0.8 µm/h.

Figure 15:
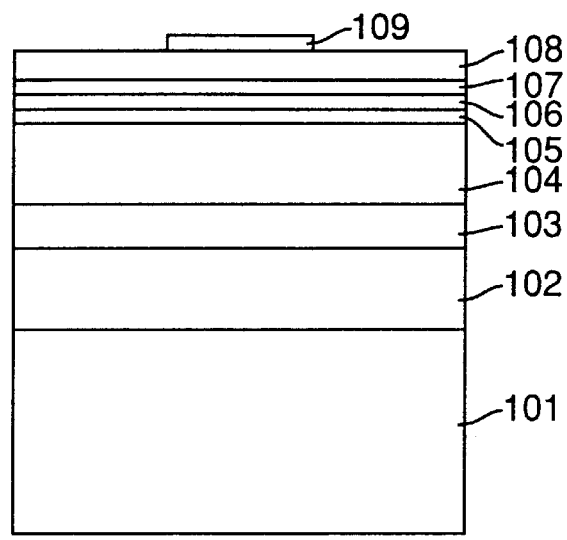
FIG. 15 is a sectional view of the above semiconductor light-emitting device, continued from FIG. 14.

Next, as shown in FIG. 15, the current stopping layer 109 is etched into, for example, a round shape by the normal photolithographic technique.

Figure 16:
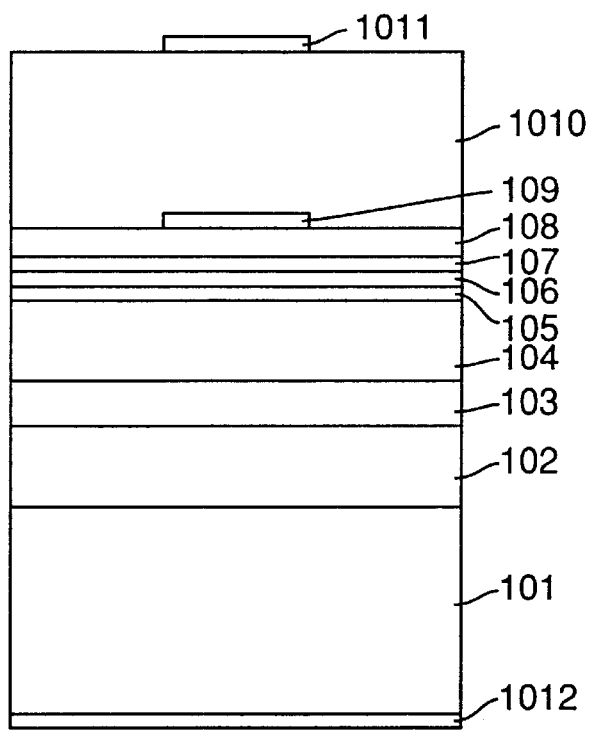
FIG. 16 is a sectional view of the above semiconductor light-emitting device, continued from FIG. 15.

Next, as shown in FIG. 16, a p-type $(Al_xGa_{1-x})_yIn_{1-y}P$ ($0 \leq x \leq 1$, $0 \leq y \leq 1$) second current diffusion layer 1010 (having the specifications of, for example, x=0.0, y=1.0, a Zn carrier density of $3 \times 10^{18}$ cm$^{-3}$ and a thickness of 7.0 µm) is made to successively grow on the above processed base.

Next, a p-type electrode 1011 (made of, for example, Au—Zn) and an n-type electrode 1012 (made of, for example, Au—Ge) are formed by vapor deposition, and then the p-type electrode 1011 is processed into, for example, a round shape, completing a light-emitting diode.

According to this tenth embodiment, the materials of the intermediate layers 105 through 107 are selected so as to satisfy the condition that the lattice constants of the intermediate layers are each intermediate between the lattice constant of the upper clad layer 104 and the lattice constant of the first current diffusion layer 108, the condition that the conduction band lower ends of the intermediate layers are each intermediate between the conduction band lower end of the upper clad layer 104 and the conduction band lower end of the first current diffusion layer 108 and the condition that the valence band upper ends of the intermediate layers are each intermediate between the valence band upper end of the upper clad layer 104 and the valence band upper end of the first current diffusion layer 108. There is produced the effect of reducing the hetero barrier at the interface between the upper clad layer 104 and the first current diffusion layer 108. However, a lattice mismatching of about −1.8% exists between the upper clad layer 104 and the first intermediate layer 105 and between the upper clad layer 104 and the first current diffusion layer 108.

According to the conventional light-emitting diode, the growth rates of the intermediate layer and the first current diffusion layer have not each been set not greater than 1 $\mu$m/h. Therefore, the crystallinity of the intermediate layer, the current diffusion layer grown on the intermediate layer and the current stopping layer has been degraded and the surface shape has also been degraded. Furthermore, the lattice mismatching causes a great many interface state densities at the interface between the upper clad layer and the intermediate layer and the interface between the intermediate layer and the first current diffusion layer, as a consequence of which the band profile is warped.

However, according to this tenth embodiment, the growth rate of the first intermediate layer 105 is set to 0.5 $\mu$m/h, and the growth rate of the first current diffusion layer 108 is set to 0.8 $\mu$m/h, the values each being not greater than 1 $\mu$m/h. Therefore, the intermediate layers 105 through 107, the first current diffusion layer 108, the current stopping layer 109 and the second current diffusion layer 1010 have better crystallinity than that of the conventional light-emitting diode. The interface state densities at the interface between the upper clad layer 104 and the intermediate layer 105 and the interface between the intermediate layer 105 and the first current diffusion layer 108 are also sharply reduced. With this arrangement, the current injected from the p-type electrode 1011 diffuses better in the second current diffusion layer 1010, and the current stopping layer 109 has an improved current stopping effect, for the improvement of the light transmittance of the second current diffusion layer 1010. The adhesion of the p-type electrode 1011 formed on the second current diffusion layer 1010 is also improved. By the sharp reduction of the interface state densities at the interface between the upper clad layer 104 and the intermediate layer 105 and the interface between the intermediate layer 105 and the first current diffusion layer 108, the warp of band profile can be suppressed. By virtue of the aforementioned effects, a high-luminance high-productivity light-emitting diode capable of operating at a low voltage can be obtained according to the tenth embodiment, by comparison with the conventional light-emitting diode.

Eleventh Embodiment

A method for producing a semiconductor light-emitting device or, for example, a light-emitting diode according to the eleventh embodiment of the present invention will be described with reference to FIGS. 17 through 19.

Figure 17:
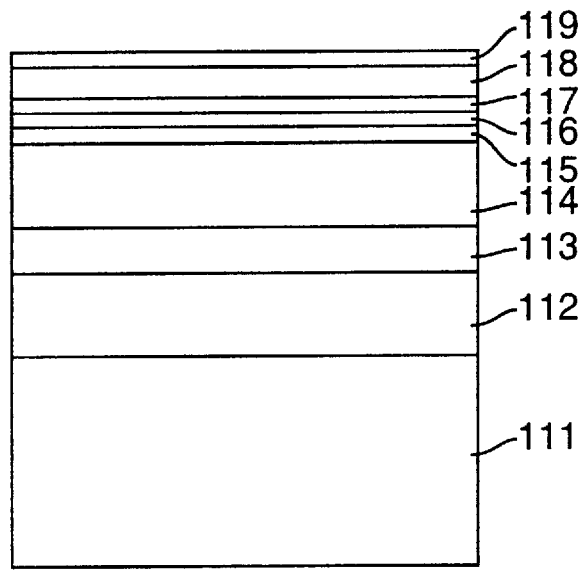
FIG. 17 is a sectional view of a semiconductor light-emitting device according to an eleventh embodiment of the present invention.

As shown in FIG. 17, an n-type $(Al_xGa_{1-x})_{0.51}In_{0.49}P$ ($0 \leq x \leq 1$) lower clad layer 112 (having the specifications of, for example, x=1.0, a Si carrier density of $5 \times 10^{17}$ cm$^{-3}$ and a thickness of 1.0 $\mu$m), an $(Al_xGa_{1-x})_{0.51}In_{0.49}P$ ($0 \leq x \leq 1$) active layer 113 (having the specifications of, for example, x=0.3 and a thickness of 0.5 $\mu$m), a p-type $(Al_xGa_{1-x})_{0.51}In_{0.49}P$ ($0 \leq x \leq 1$) upper clad layer 114 (having the specifications of, for example, x=1.0, a Zn carrier density of $5 \times 10^{17}$ cm$^{-3}$ and a thickness of 1.0 $\mu$m), a p-type $(Al_xGa_{1-x})_yIn_{1-y}P$ ($0 \leq x \leq 1$, $0 \leq y \leq 1$) first intermediate layer 115 (having the specifications of, for example, x=0.5, y=0.38, a Zn carrier density of $3 \times 10^{18}$ cm$^{-3}$ and a thickness of 0.5 $\mu$m), a p-type $(Al_xGa_{1-x})_yIn_{1-y}P$ ($0 \leq x \leq 1$, $0 \leq y \leq 1$) second intermediate layer 116 (having the specifications of, for example, x=0.3, y=0.25, a Zn carrier density of $3 \times 10^{18}$ cm$^{-3}$ and a thickness of 0.5 $\mu$m), a p-type $(Al_xGa_{1-x})_yIn_{1-y}P$ ($0 \leq x \leq 1$, $0 \leq y \leq 1$) third intermediate layer 117 (having the specifications of, for example, x=0.2, y=0.13, Zn carrier density of $3 \times 10^{18}$ cm$^{-3}$ and a thickness of 0.5 $\mu$m), a p-type $(Al_xGa_{1-x})_yIn_{1-y}P$ ($0 \leq x \leq 1$, $0 \leq y \leq 1$) first current diffusion layer 118 (having the specifications of, for example, x=0.0, y=1.0, a Zn carrier density of $3 \times 10^{18}$ cm$^{-3}$ and a thickness of 1.5 $\mu$m) and an n-type $(Al_xGa_{1-x})_yIn_{1-y}P$ ($0 \leq x \leq 1$, $0 \leq y \leq 1$) current stopping layer 119 (having the specifications of, for example, x=0.0, y=1.0, a Si carrier density of $1 \times 10^{18}$ cm$^{-3}$ and a thickness of 0.3 $\mu$m) are successively formed on an n-type GaAs substrate 111. In this stage, the growth rates of the first intermediate layer 115, the second intermediate layer 116 and the third intermediate layer 117 are each set to 0.5 $\mu$m/h, and the growth rate of the first current diffusion layer 118 is set to 0.8 $\mu$m/h.

Figure 18:
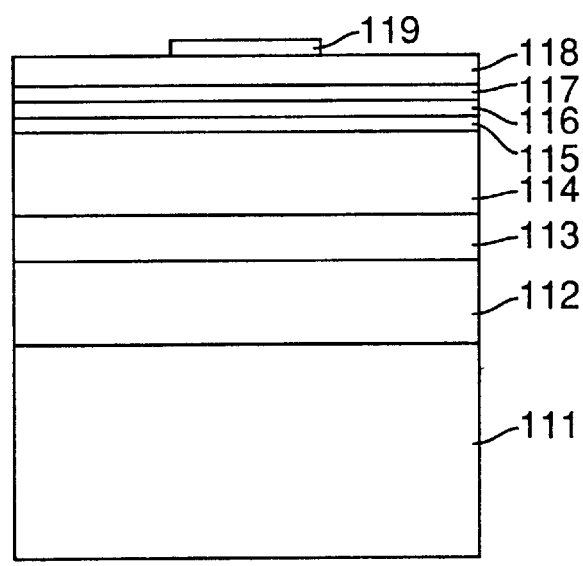
FIG. 18 is a sectional view of the above semiconductor light-emitting device, continued from FIG. 17.

Next, as shown in FIG. 18, the current stopping layer 119 is etched into, for example, a round shape by the normal photolithographic technique.

Figure 19:
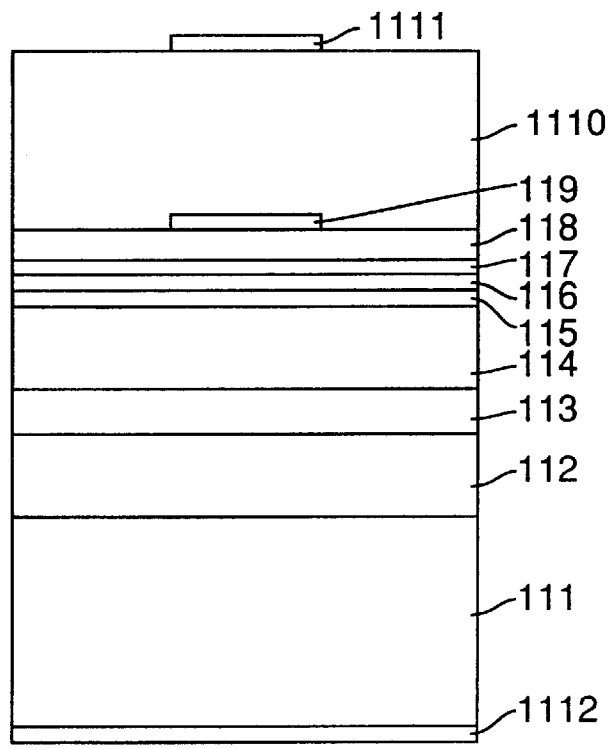
FIG. 19 is a sectional view of the above semiconductor light-emitting device, continued from FIG. 18.

Next, as shown in FIG. 19, a p-type $(Al_xGa_{1-x})_yIn_{1-y}P$ ($0 \leq x \leq 1$, $0 \leq y \leq 1$) second current diffusion layer 1110 (having the specifications of, for example, x=0.0, y=1.0, a Zn carrier density of $3 \times 10^{18}$ cm$^{-3}$ and a thickness of 7.0 $\mu$m) is made to grow on the above processed base.

Next, a p-type electrode 1111 (made of, for example, Au—Zn) and an n-type electrode 1112 (made of, for example, Au—Ge) are formed by vapor deposition, and then the p-type electrode 1111 is processed into, for example, a round shape, completing a light-emitting diode.

According to this eleventh embodiment, the materials of the intermediate layers 115 through 117 are selected so as to satisfy the condition that the lattice constants of the intermediate layers 115 through 117 are each intermediate between the lattice constant of the upper clad layer 114 and the lattice constant of the first current diffusion layer 118, the condition that the conduction band lower ends of the intermediate layers 115 through 117 are each intermediate between the conduction band lower end of the upper clad layer 114 and the conduction band lower end of the first current diffusion layer 118 and the condition that the valence band upper ends of the intermediate layers 115 through 117 are each intermediate between the valence band upper end of the upper clad layer 114 and the valence band upper end of the first current diffusion layer 118. There is produced the effect of reducing the hetero barrier at the interface between the upper clad layer and the current diffusion layer. Furthermore, the intermediate layers 115 through 117 are each made to have a composition such that their conduction band lower ends, the valence band upper ends and the lattice constants are intermediate between the respective ones of the two layers that are located above and below in contact with the intermediate layers. However, a lattice mismatching of –0.9% exists in each of the four interfaces between the layers of the upper clad layer 114 through the first current diffusion layer 118.

According to the conventional light-emitting diode, the growth rates of the intermediate layer and the first current diffusion layer have not each been set not greater than 1 $\mu$m/h. Therefore, the crystallinity of the intermediate layer, the current diffusion layer grown on the intermediate layer and the current stopping layer has been degraded, and the surface shape has also been degraded. Furthermore, the lattice mismatching causes a great many interface state densities at the interface between the upper clad layer and the intermediate layer, the interface between the intermediate layer and the first current diffusion layer and the interfaces between the intermediate layers, as a consequence of which the band profile is warped at each interface.

However, according to this eleventh embodiment, the growth rates of the first intermediate layer 115, the second intermediate layer 116 and the third intermediate layer 117 are each set to 0.5 μm/h, and the growth rate of the first current diffusion layer 118 is set to 0.8 μm/h, the values each being not greater than 1 μm/h. Therefore, the intermediate layers 115 through 117, the first current diffusion layer 118, the current stopping layer 119 and the second current diffusion layer 1110 have better crystallinity than that of the conventional light-emitting diode, and the surface shape is almost flat. The interface state densities at the interface between the upper clad layer 114 and the intermediate layer 115 and the interface between the intermediate layer 115 and the first current diffusion layer 118 are also sharply reduced. With this arrangement, the current injected from the p-type electrode 1111 diffuses better in the second current diffusion layer 1110, and the current stopping layer 119 has an improved current stopping effect, for the improvement of the light transmittance of the second current diffusion layer 1110. The adhesion of the p-type electrode 1111 formed on the second current diffusion layer 1110 is also improved. By the sharp reduction of the interface state densities at the interface between the upper clad layer 114 and the intermediate layer 115 and the interface between the intermediate layer 115 and the first current diffusion layer 118, the warp of the band profile can be suppressed. By virtue of the aforementioned effects, a high-luminance high-productivity light-emitting diode capable of operating at a low voltage can be obtained according to the eleventh embodiment, by comparison with the conventional light-emitting diode.

Twelfth Embodiment

A method for producing a semiconductor light-emitting device or, for example, a light-emitting diode according to the twelfth embodiment of the present invention will be described with reference to FIGS. 20 through 23.

Figure 20:
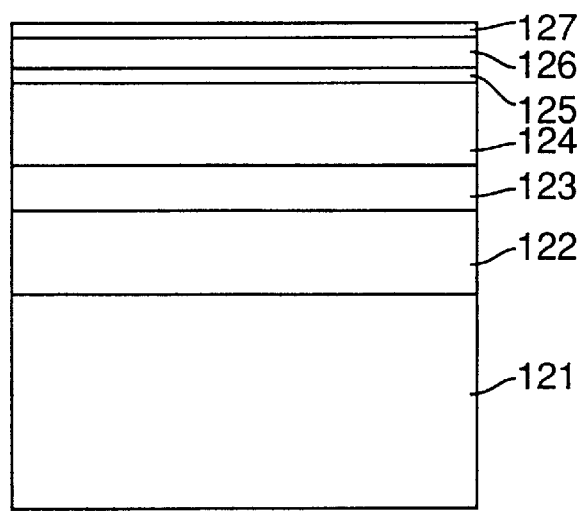
FIG. 20 is a sectional view of a semiconductor light-emitting device according to a twelfth embodiment of the present invention.

As shown in FIG. 20, an n-type $(Al_xGa_{1-x})_{0.51}In_{0.49}P$ ($0 \leq x \leq 1$) lower clad layer 122 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 123 (having the specifications of, for example, x=0.3 and a thickness of 0.5 μm), a p-type $(Al_xGa_{1-x})_{0.51}In_{0.49}P$ ($0 \leq x \leq 1$) upper clad layer 124 (having the specifications of, for example, x=1.0, a Zn carrier density of $5 \times 10^{17}$ cm$^{-3}$ and a thickness of 1.0 μm), a p-type $(Al_xGa_{1-x})_yIn_{1-y}P$ ($0 \leq x \leq 1$, $0 \leq y \leq 1$) first intermediate layer 125 (having the specifications of, for example, x=0.2, y=0.75, a Zn carrier density of $3 \times 10^{18}$ cm$^{-3}$ and a thickness of 0.5 μm), a p-type $(Al_xGa_{1-x})_yIn_{1-y}P$ ($0 \leq x \leq 1$, $0 \leq y \leq 1$) first current diffusion layer 126 (having the specifications of, for example, x=0.0, y=1.0, a Zn carrier density of $3 \times 10^{18}$ cm$^{-3}$ and a thickness of 1.5 μm) and an n-type $(Al_xGa_{1-x})_yIn_{1-y}P$ ($0 \leq x \leq 1$, $0 \leq y \leq 1$) current stopping layer 127 (having the specifications of, for example, x=0.0, y=1.0, a Si carrier density of $1 \times 10^{18}$ cm$^{-3}$ and a thickness of 0.3 μm) are made to successively grow on an n-type GaAs substrate 121. In this stage, the growth rates of the intermediate layer 125 and the first current diffusion layer 126 are each set as follows.

Figure 21:
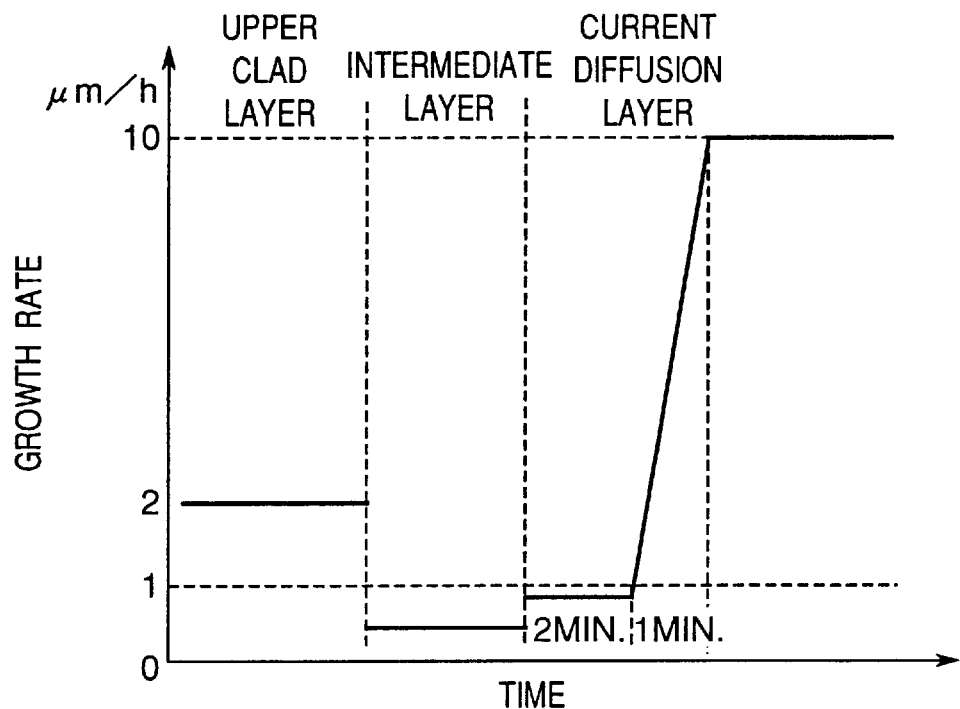
FIG. 21 is a graph showing the growth rates of the layers of the above semiconductor light-emitting device.

As shown in FIG. 21, the upper clad layer is made to grow at a rate of 2 μm/h, and thereafter the first intermediate layer 125 is made to grow at a rate of, for example, 0.5 μm/h, which is not greater than 1 μm/h. Subsequently, the first current diffusion layer 126 starts to grow at a rate of, for example, 0.8 μm/h, which is not greater than 1 μm/h. After continuing the growth for a while (about two minutes, for example), the growth rate is increased to, for example, 10 μm/h per minute, and the growth is continued at a rate of 10 μm/h until the completion of the growth of the first current diffusion layer 126.

Figure 22:
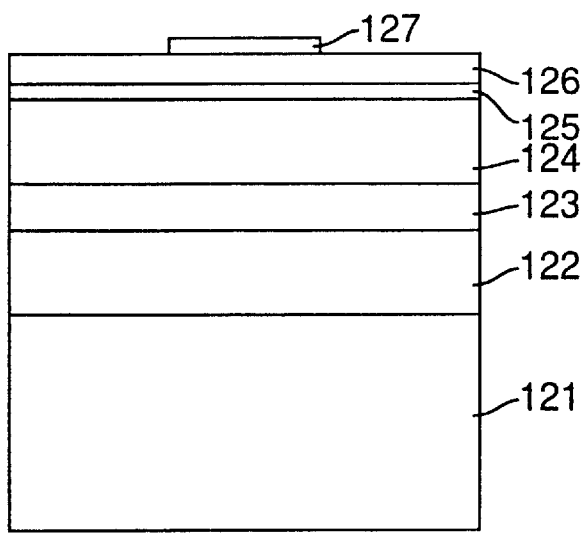
FIG. 22 is a sectional view of the above semiconductor light-emitting device, continued from FIG. 20.

Next, as shown in FIG. 22, the current stopping layer 127 is etched into, for example, a round shape by the normal photolithographic technique.

Figure 23:
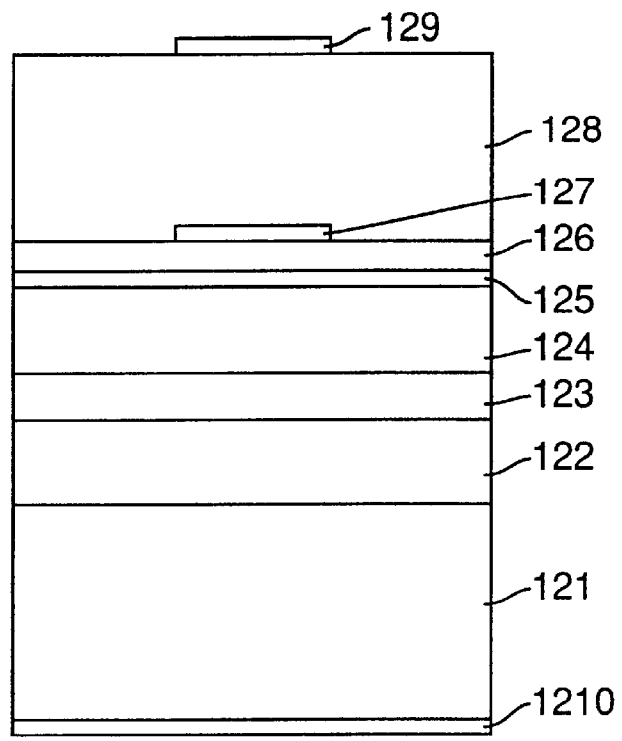
FIG. 23 is a sectional view of the above semiconductor light-emitting device, continued from FIG. 22.

Next, as shown in FIG. 23, a p-type $(Al_xGa_{1-x})_yIn_{1-y}P$ ($0 \leq x \leq 1$, $0 \leq y \leq 1$) second current diffusion layer 128 (having the specifications of, for example, x=0.0, y=1.0, a Zn carrier density of $3 \times 10^{18}$ cm$^{-3}$ and a thickness of 7.0 μm) is made to grow on the above processed base.

Next, a p-type electrode 129 (made of, for example, Au—Zn) and an n-type electrode 1210 (made of, for example, Au—Ge) are formed by vapor deposition, and then the p-type electrode 129 is processed into, for example, a round shape, completing a light-emitting diode.

According to this twelfth embodiment, the material of the intermediate layer 125 is selected so as to satisfy the condition that the lattice constant of the intermediate layer 125 is intermediate between the lattice constant of the upper clad layer 124 and the lattice constant of the first current diffusion layer 126, the condition that the conduction band lower end of the intermediate layer 125 is intermediate between the conduction band lower end of the upper clad layer 124 and the conduction band lower end of the first current diffusion layer 126 and the condition that the valence band upper end of the intermediate layer 125 is intermediate between the valence band upper end of the upper clad layer 124 and the valence band upper end of the first current diffusion layer 126. There is produced the effect of reducing the hetero barrier at the interface between the upper clad layer and the current diffusion layer. However, a lattice mismatching of about −1.8% exists between the upper clad layer 124 and the intermediate layer 125 and between the intermediate layer 125 and the first current diffusion layer 126.

According to the conventional light-emitting diode, the growth rates of the intermediate layer and the first current diffusion layer have not each been set not greater than 1 μm/h. Therefore, the crystallinity of the intermediate layer, the current diffusion layer grown on the intermediate layer and the current stopping layer has been degraded, and the surface shape has also been degraded. Furthermore, the lattice mismatching causes a great many interface state densities at the interface between the upper clad layer and the intermediate layer and the interface between the intermediate layer and the first current diffusion layer. Therefore, the band profile has been warped at each interface.

However, according to this twelfth embodiment, the growth rate of the intermediate layer 125 is set to 0.5 μm/h, and the growth rate in the initial stage of growth of the first current diffusion layer 126 is set to 0.8 μm/h, the values each being not greater than 1 μm/h. Therefore, the intermediate layer 125, the first current diffusion layer 126, the current stopping layer 127 and the second current diffusion layer 128 have better crystallinity than that of the conventional light-emitting diode, and the surface shape is almost flat. The interface state densities at the interface between the upper clad layer 124 and the intermediate layer 125 and the interface between the intermediate layer 125 and the first current diffusion layer 126 are also sharply reduced. With this arrangement, the current injected from the p-type electrode 129 diffuses better in the second current diffusion layer 128, and the current stopping layer 127 has an improved current stopping effect, for the improvement of the light transmittance of the second current diffusion layer 128. The adhesion of the p-type electrode 129 formed on the second current diffusion layer 128 is also improved. By the sharp reduction of interface state densities at the interface between the upper clad layer 124 and the intermediate layer 125 and the interface between the intermediate layer 125 and the first current diffusion layer 126, the warp of band profile can be suppressed. Furthermore, according to the thirteenth embodiment, the growth rate of the current diffusion layer is increased partway to a high rate of 10 μm/h, and therefore, the time of growth is reduced, allowing the time, material cost and personal expenses necessary for producing the light-emitting diode to be reduced. By virtue of the aforementioned effects, a high-luminance high-productivity light-emitting diode capable of operating at a low voltage can be obtained according to the twelfth embodiment, by comparison with the conventional light-emitting diode.

Thirteenth Embodiment

A method for producing a semiconductor light-emitting device or, for example, a light-emitting diode according to the thirteenth embodiment of the present invention will be described with reference to FIGS. 24 through 27.

Figure 24:
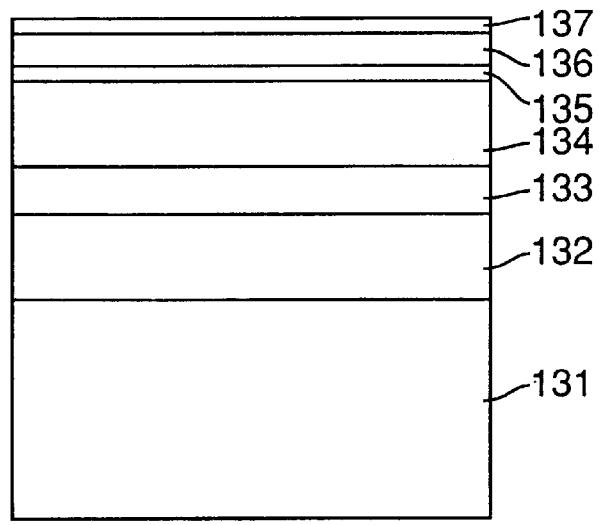
FIG. 24 is a sectional view of a semiconductor light-emitting device according to a thirteenth embodiment of the present invention.

As shown in FIG. 24, an n-type $(Al_xGa_{1-x})_{0.51}In_{0.49}P$ ($0 \leq x \leq 1$) lower clad layer 132 (having the specifications of, for example, x=1.0, a Si carrier density of $5 \times 10^{17}$ cm$^{-3}$ and a thickness of 1.0 μm), an $(Al_xGa_{1-x})_{0.51}In_{0.49}P$ ($0 \leq x \leq 1$) active layer 133 (having the specifications of, for example, x=0.3 and a thickness of 0.5 μm), a p-type $(Al_xGa_{1-x})_{0.51}In_{0.49}P$ ($0 \leq x \leq 1$) upper clad layer 134 (having the specifications of, for example, x=1.0, a Zn carrier density of $5 \times 10^{17}$ cm$^{-3}$ and a thickness of 1.0 μm), a p-type $(Al_xGa_{1-x})_yIn_{1-y}P$ ($0 \leq x \leq 1$, $0 \leq y \leq 1$) intermediate layer 135 (having the specifications of, for example, x=0.2, y=0.25, a Zn carrier density of $3 \times 10^{18}$ cm$^{-3}$ and a thickness of 0.5 μm), a p-type $(Al_xGa_{1-x})_yIn_{1-y}P$ ($0 \leq x \leq 1$, $0 \leq y \leq 1$) first current diffusion layer 136 (having the specifications of, for example, x=0.0, y=1.0, a Zn carrier density of $3 \times 10^{18}$ cm$^{-3}$ and a thickness of 1.5 μm) and an n-type $(Al_xGa_{1-x})_yIn_{1-y}P$ ($0 \leq x \leq 1$, $0 \leq y \leq 1$) current stopping layer 137 (having the specifications of, for example, x=0.0, y=1.0, a Si carrier density of $1 \times 10^{18}$ cm$^{-3}$ and a thickness of 0.3 μm) are made to successively grow on an n-type GaAs substrate 131. In this stage, the temperature of growth of each layer is set as follows.

Figure 25:
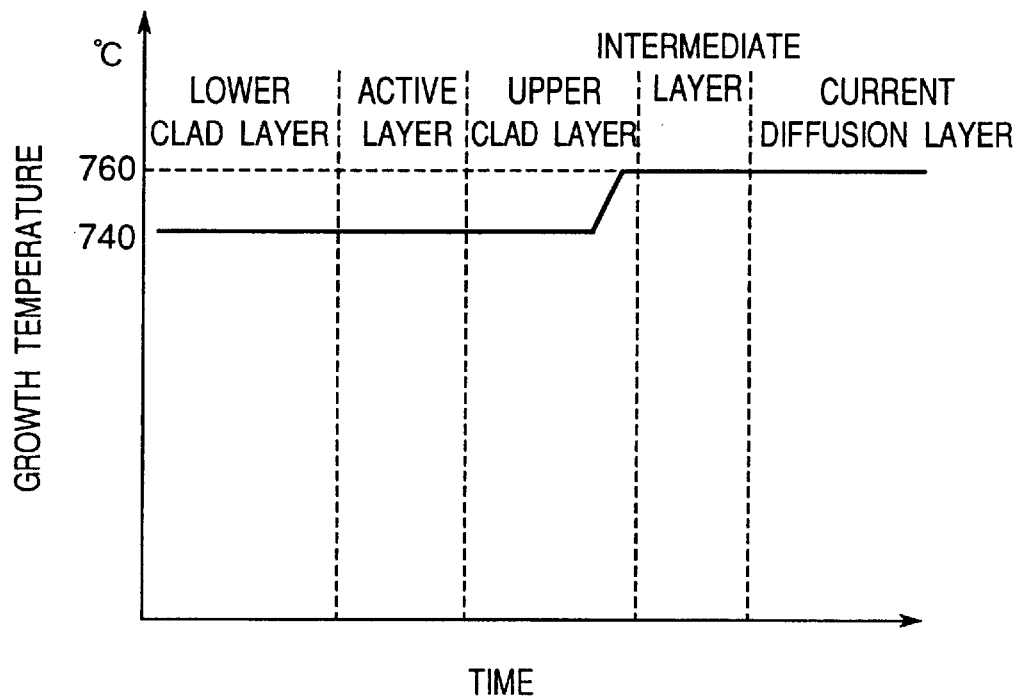
FIG. 25 is a graph showing the growth temperatures of the layers of the above semiconductor light-emitting device.

As shown in FIG. 25, the upper clad layer 134 is made to grow partway at a temperature of, for example, 740° C., and thereafter, the temperature of growth of the remaining part of the upper clad layer 134 is increased to a temperature (760° C., for example) higher than the temperature of growth of the above-mentioned part. The remaining part of the upper clad layer 134, the intermediate layer 135, the first current diffusion layer 136 and the current stopping layer 137 are made to grow at a temperature of 760° C. In this stage, the growth rate of the intermediate layer 135 is set to 0.5 μm/h, and the growth rate of the first current diffusion layer is set to 0.8 μm/h.

Figure 26:
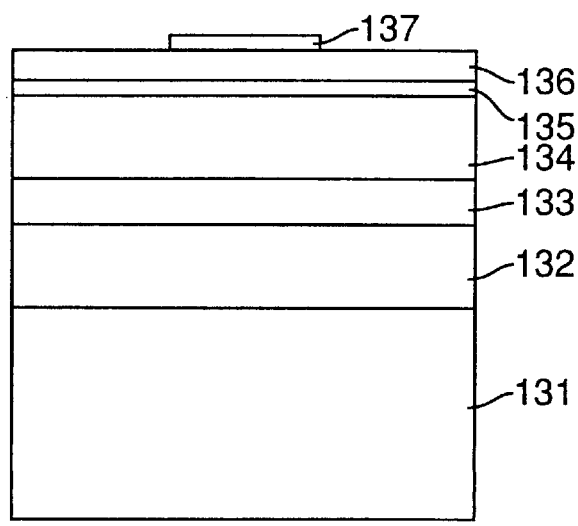
FIG. 26 is a sectional view of the above semiconductor light-emitting device, continued from FIG. 24.

Next, as shown in FIG. 26, the current stopping layer 137 is etched into, for example, a round shape by the normal photolithographic technique.

Figure 27:
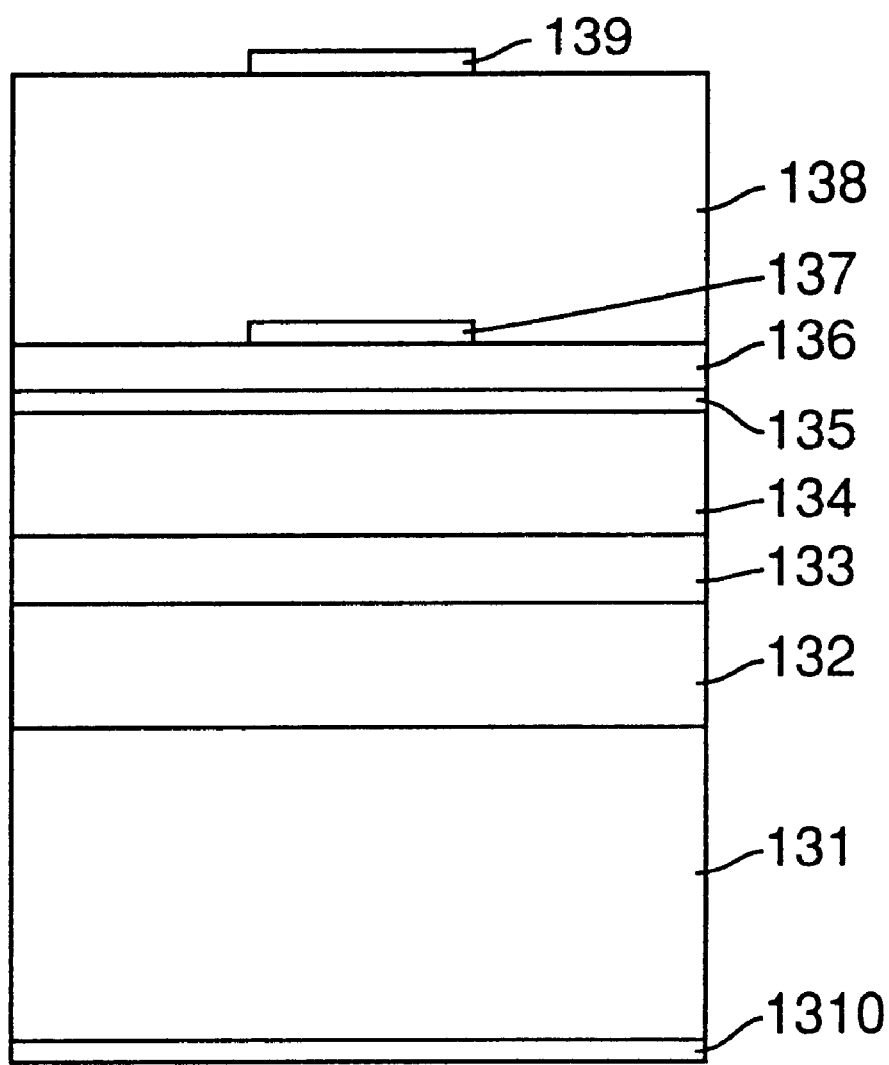
FIG. 27 is a sectional view of the above semiconductor light-emitting device, continued from FIG. 26.
Figure 28:
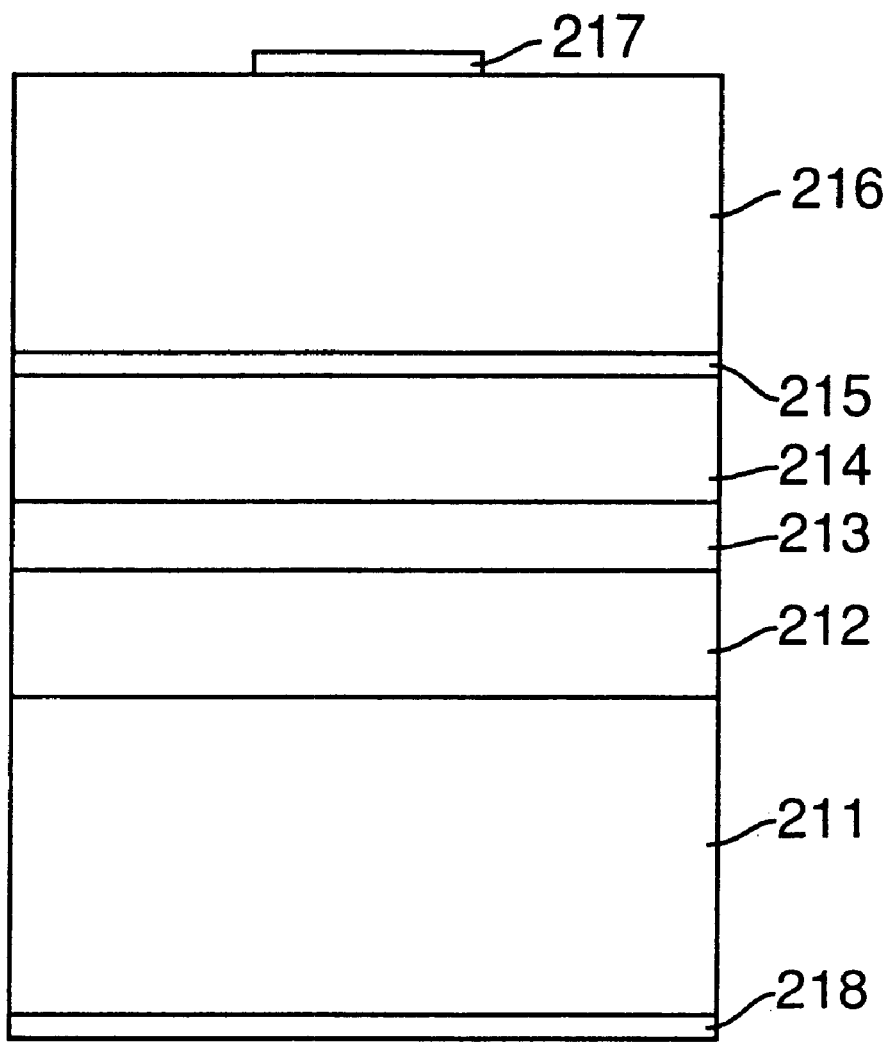
FIG. 28 is a sectional view showing a prior art semiconductor light-emitting device.
Figure 29A:
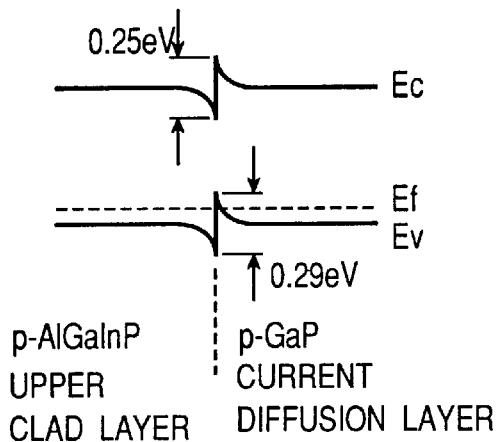
FIGS. 29A and 29B are views of energy profiles of the above semiconductor light-emitting device.
Figure 29B:
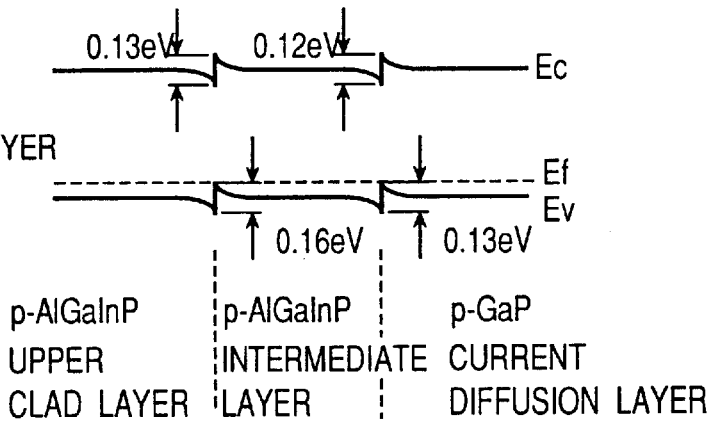
Figure 30A:
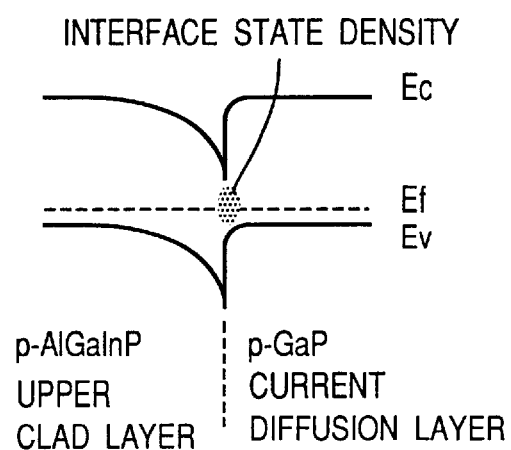
FIGS. 30A and 30B are views of energy profiles of the above semiconductor light-emitting device.
Figure 30B:
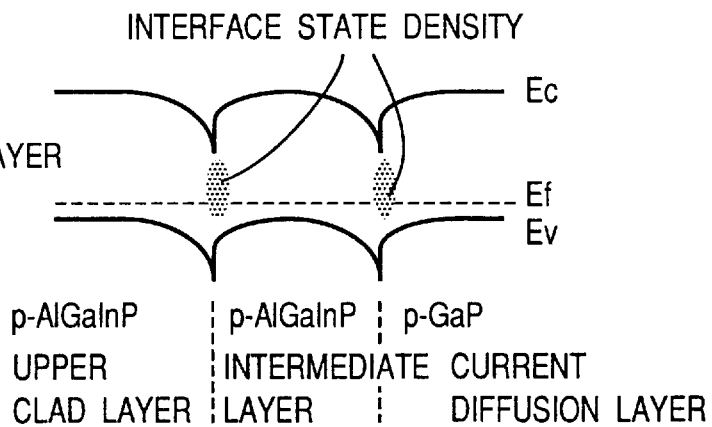

Next, as shown in FIG. 27, a p-type $(Al_xGa_{1-x})_yIn_{1-y}P$ ($0 \leq x \leq 1$, $0 \leq y \leq 1$) second current diffusion layer 138 (having the specifications of, for example, x=0.0, y=1.0, a Zn carrier density of $3 \times 10^{18}$ cm$^{-3}$ and a thickness of 7.0 μm) is made to grow on the above processed base. Next, a p-type electrode 139 (made of, for example, Au—Zn) and an n-type electrode 1310 (made of, for example, Au—Ge) are formed by vapor deposition, and then the p-type electrode 139 is processed into, for example, a round shape, completing a light-emitting diode.

According to this thirteenth embodiment, the material of the intermediate layer 135 is selected so as to satisfy the condition that the lattice constant of the intermediate layer 135 is intermediate between the lattice constant of the upper clad layer 134 and the lattice constant of the first current diffusion layer 136, the condition that the conduction band lower end of the intermediate layer 135 is intermediate between the conduction band lower end of the upper clad layer 134 and the conduction band lower end of the first current diffusion layer 136 and the condition that the valence band upper end of the intermediate layer 135 is intermediate between the valence band upper end of the upper clad layer 134 and the valence band upper end of the first current diffusion layer 136. There is produced the effect of reducing the hetero barrier at the interface between the upper clad layer and the current diffusion layer. However, a lattice mismatching of about −1.8% exists between the upper clad layer 134 and the intermediate layer 135 and between the intermediate layer 135 and the first current diffusion layer 136.

According to the conventional light-emitting diode, the temperature of growth of the layers extending from the lower clad layer to the current stopping layer is set to the optimum temperature of growth of the light-emitting section. Therefore, the crystallinity of the intermediate layer, the current diffusion layer grown on the intermediate layer and the current stopping layer has been degraded, and the surface shape has also been degraded. Furthermore, the lattice mismatching causes a great many interface state densities at the interface between the upper clad layer and the intermediate layer and the interface between the intermediate layer and the first current diffusion layer. Therefore, the band profile has been warped at each interface.

However, at the interface where a lattice mismatching exists, the crystallinity becomes better when migration (the thermal motion of ionized atoms and molecules on the crystal surface during the growth process) is promoted through the growth at a high temperature, meaning that the growth should preferably be performed at a temperature higher than the optimum temperature of growth of the light-emitting section. Accordingly, in this thirteenth embodiment, the interface between the upper clad layer 134 and the intermediate layer 135 and the interface between the intermediate layer 135 and the first current diffusion layer 136 are grown at a temperature higher than the temperature of growth of the light-emitting section. Therefore, the intermediate layer 135, the first current diffusion layer 136, the current stopping layer 137 and the second current diffusion layer 138 have better crystallinity than that of the conventional light-emitting diode, and the surface shape is almost flat. The interface state densities at the interface between the upper clad layer 134 and the intermediate layer 135 and the interface between the intermediate layer 135 and the first current diffusion layer 136 are also sharply reduced. With this arrangement, the current injected from the p-type electrode 139 diffuses better in the second current diffusion layer 138, and the current stopping layer 137 has an improved current stopping effect, for the improvement of the light transmittance of the second current diffusion layer 138. The adhesion of the p-type electrode 139 formed on the second current diffusion layer 138 is also improved. By the sharp reduction of interface state densities at the interface between the upper clad layer 134 and the intermediate layer 135 and the interface between the intermediate layer 135 and the first current diffusion layer 136, the warp of band profile can be suppressed. By virtue of the aforementioned effects, a high-luminance high-productivity light-emitting diode capable of operating at a low voltage can be obtained according to the thirteenth embodiment, by comparison with the conventional light-emitting diode.

It is to be noted that the present invention is limited to neither one of the aforementioned embodiments. Although the AlGaInP-based semiconductor is used for the light-emitting section in the first through thirteenth embodiments, the present invention can be applied to even a semiconductor light-emitting device that employs another material so long as the contents of functions and the roles of layers are equivalent. Likewise, the materials and composition ratios of the other layers can be changed within a range in which the intended effect can be obtained.

Although the current diffusion layer and the current stopping layer are used for the layer to be grown on the upper clad layer or the layer grown on the intermediate layer, it is also acceptable to employ another layer such as a protective layer or an etching stop layer.

The present invention can be subject to a variety of modifications within a scope not departing from the essence thereof.

The invention being thus described, it will be obvious that the same may be varied in many ways. Such variations are not be regarded as a departure from the sprit and scope of the invention, and all such modifications as would be obvious to one skilled in the art are intended to be included within the scope of the following claims.

What is claimed is:

1. A method for producing a semiconductor light-emitting device having a light-emitting section comprising at least a lower clad layer, an active layer and an uppermost clad layer which are formed on a compound semiconductor substrate, an intermediate layer formed on the uppermost clad layer of the light-emitting section and a layer grown directly on the intermediate layer, the intermediate layer being made of a material selected so as to satisfy a condition that a conduction band lower end of the intermediate layer is intermediate between a conduction band lower end of the uppermost clad layer and a conduction band lower end of the layer grown on the intermediate layer or a condition that a valence band upper end of the intermediate layer is intermediate between a valence band upper end of the uppermost clad layer and a valence band upper end of the layer grown on the intermediate layer in an energy position prior to the formation of a junction, growing the intermediate layer directly on the uppermost clad layer in a lattice mismatching state in which the absolute value of a lattice matching factor $\Delta a/a$ is not lower than 0.25% with respect to the uppermost clad layer, a growth rate at least at a start time of said growing of the intermediate layer is made to be less than 1.0 $\mu$m/h, and initially growing the layer grown on the intermediate layer at a first growth rate and thereafter increasing the growth rate to a second growth rate so that the layer grown on the intermediate layer is grown at least the first and second growth rates.

2. A method for producing a semiconductor light-emitting device as claimed in claim 1, wherein the layer grown on the intermediate layer includes at least one of a current diffusion layer and a current stopping layer.

3. A method for producing a semiconductor light-emitting device as claimed in claim 2, wherein the lower clad layer, the active layer, the uppermost clad layer, the intermediate layer, the current diffusion layer and the current stopping layer each comprise $(Al_xGa_{1-x})_yIn_{1-y}P$ ($0 \leq x \leq 1$, $0 \leq y \leq 1$), wherein the intermediate layer, the current diffusion layer, and the current stopping layer are successively formed in this order on the uppermost clad layer.

4. A method for producing a semiconductor light-emitting device as claimed in claim 2, wherein the lower clad layer, the active layer and the uppermost clad layer comprise $(Al_xGa_{1-x})_yIn_{1-y}P$ ($0 \leq x \leq 1$, $0 \leq y \leq 1$) and the current diffusion layer and the current stopping layer comprise GaP.

5. A method for producing a semiconductor light-emitting device as claimed in claim 2, wherein a growth temperature at the time of ending the growth of the uppermost clad layer and growth temperatures of the intermediate layer and the current diffusion layer are made higher than a growth temperature of the light-emitting section except for the growth temperature at the time of ending the growth of the uppermost clad layer.

6. A method for producing a semiconductor light-emitting device as claimed in claim 2, wherein the lower clad layer, the active layer, the uppermost clad layer, the intermediate layer, the current diffusion layer and the current stopping layer are grown by a metal-organic chemical vapor deposition method.

7. A method for producing a semiconductor light-emitting device as claimed in claim 1, wherein the intermediate layer is comprised of two or more layers.

8. A method for producing a semiconductor light-emitting device as claimed in claim 7, wherein when growing an (n+1)-th intermediate layer in a lattice mismatching state in which the absolute value of a lattice matching factor $\Delta a/a$ is not lower than 0.25% with respect to an n-th grown intermediate layer of the intermediate layers, a growth rate at least at a start time of growth is made to be not greater than 1.0 $\mu$m/h.

9. A method for producing a semiconductor light-emitting device as claimed in claim 8, wherein at least one layer which the growth rate at the start time of growth is less than 1.0 $\mu$m/h is made to have a growth rate of greater than 1 $\mu$m/h except when starting the growth.

10. A method for producing a semiconductor light-emitting device as claimed in claim 7, wherein at least one layer which the growth rate at the start time of growth is less than 1.0 $\mu$m/h is made to have a growth rate of greater than 1 $\mu$m/h except when starting the growth.

11. A method for producing a semiconductor light-emitting device having a light-emitting section comprised of at least a lower clad layer, an active layer and an uppermost clad layer which are formed on a compound semiconductor substrate, an intermediate layer formed on the uppermost clad layer of the light-emitting section and a layer grown on the intermediate layer, the intermediate layer being made of a material selected so as to satisfy a condition that a conduction band lower end of the intermediate layer is intermediate between a conduction band lower end of the uppermost clad layer and a conduction band lower end of the layer grown on the intermediate layer or a condition that a valence band upper end of the intermediate layer is intermediate between a valence band upper end of the uppermost clad layer and a valence band upper end of the layer grown on the intermediate layer in an energy position prior to the formation of a junction, wherein when growing the layer directly on the intermediate layer in a lattice mismatching state in which the absolute value of a lattice matching factor Δa/a is not lower than 0.25% with respect to the intermediate layer, a growth rate at least at a start time of growth of the layer directly on the intermediate layer is a first growth rate made to be less than 1.0 μm/h, and thereafter increasing the growth rate to a second growth rate so that the layer grown directly on the intermediate layer is grown at least the first and second growth rates.

12. A method for producing a semiconductor light-emitting device as claimed in claim 11, wherein
the layer grown on the intermediate layer includes at least one of a current diffusion layer and a current stopping layer.

13. A method for producing a semiconductor light-emitting device as claimed in claim 11, wherein
the intermediate layer is comprised of two or more layers.

14. A method for producing a semiconductor light-emitting device having a light-emitting section comprised of at least a lower clad layer, an active layer and an uppermost clad layer which are formed on a compound semiconductor substrate, an intermediate layer formed on the uppermost clad layer of the light-emitting section and a layer grown on the intermediate layer, the intermediate layer being made of a material selected so as to satisfy a condition that a conduction band lower end of the intermediate layer is intermediate between a conduction band lower end of the uppermost clad layer and a conduction band lower end of the layer grown on the intermediate layer or a condition that a valence band upper end of the intermediate layer is intermediate between the valance band upper end of the uppermost clad layer and a valence band upper end of the layer grown on the intermediate layer is satisfied in an energy position prior to the formation of a junction, wherein
when growing the intermediate layer directly on the uppermost clad layer in a lattice mismatching state in which the absolute value of a lattice matching factor Δa/a is not lower than 0.25% with respect to the uppermost clad layer and when growing the layer directly on the intermediate layer in a lattice mismatching state in which the absolute value of the lattice matching factor Δa/a is not lower than 0.25% with respect to the intermediate layer, a growth rate at least at a start time of growth of both the intermediate layer and the layer directly on the intermediate layer is made to be less than 1.0 μm/h, and wherein a growth rate of the layer grown directly on the intermediate layer is increased during growth of the layer grown directly on the intermediate layer.

15. A method for producing a semiconductor light-emitting device as claimed in claim 14, wherein
the layer grown on the intermediate layer includes at least one of a current diffusion layer and a current stopping layer.

16. A method for producing a semiconductor light-emitting device as claimed in claim 14, wherein
the intermediate layer is comprised of two or more layers.

17. A method for producing a semiconductor light-emitting device as claimed in claim 14, wherein
at least one layer which the growth rate at the start time of growth is less than 1.0 μm/h is made to have a growth rate of greater than 1 μm/h except when starting the growth.

18. The method of claim 14, wherein said growth of the intermediate layer directly on the uppermost clad layer is done at a growth rate of no greater than 0.8 μm/h.

19. A method for producing a semiconductor light-emitting device having a light-emitting section comprising at least a lower clad layer, an active layer and an uppermost clad layer which are formed on a compound semiconductor substrate, an intermediate layer formed directly on the uppermost clad layer of the light-emitting section and a layer grown directly on the intermediate layer, the intermediate layer having a lattice constant intermediate between a lattice constant of the uppermost clad layer and a lattice constant of the layer grown on the intermediate layer, wherein
when growing the intermediate layer directly on the uppermost clad layer in a lattice mismatching state in which the absolute value of a lattice matching factor Δa/a is not lower than 0.25% with respect to the uppermost clad layer, a growth rate at least at a start time of growth is less than 1.0 μm/h and during growth of the layer grown directly on the intermediate layer the growth rate thereof is increased from a first growth rate below 1.0 it/h to a higher second growth rate above 1.0 μ/h.

20. A method for producing a semiconductor light-emitting device as claimed in claim 19, wherein
the layer grown on the intermediate layer includes at least one of a current diffusion layer and a current stopping layer.

21. A method for producing a semiconductor light-emitting device as claimed in claim 20, wherein
the lower clad layer, the active layer, the uppermost clad layer, the intermediate layer, the current diffusion layer and the current stopping layer each comprise $(Al_xGa_{1-x})_yIn_{1-y}P$ ($0 \leq x \leq 1$, $0 \leq y \leq 1$),
wherein the intermediate layer, the current diffusion layer, and the current stopping layer are successively formed in this order on the uppermost clad layer.

22. A method for producing a semiconductor light-emitting device as claimed in claim 20, wherein
the lower clad layer, the active layer and the uppermost clad layer comprise $(Al_xGa_{1-x})_yIn_{1-y}P$ ($0 \leq x \leq 1$, $0 \leq y \leq 1$) and
the current diffusion layer and the current stopping layer comprise GaP.

23. A method for producing a semiconductor light-emitting device as claimed in claim 20, wherein
a growth temperature at the time of ending the growth of the uppermost clad layer and growth temperatures of the intermediate layer and the current diffusion layer are made higher than a growth temperature of the light-emitting section except for the growth temperature at the time of ending the growth of the uppermost clad layer.

24. A method for producing a semiconductor light-emitting device as claimed in claim 20, wherein
the lower clad layer, the active layer, the uppermost clad layer, the intermediate layer, the current diffusion layer and the current stopping layer are grown by a metal-organic chemical vapor deposition method.

25. A method for producing a semiconductor light-emitting device as claimed in claim 19, wherein
the intermediate layer is comprised of two or more layers.

26. A method for producing a semiconductor light-emitting device as claimed in claim 25, wherein
when growing an (n+1)-th intermediate layer in a lattice mismatching state in which the absolute value of a lattice matching factor Δa/a is not lower than 0.25% with respect to an n-th grown intermediate layer of the intermediate layers, a growth rate at least at a start time of growth is made to be not greater than 1.0 μm/h.

27. The method of claim 19, wherein said growth of the intermediate layer directly on the uppermost clad layer is done at a growth rate of no greater than 0.8 μm/h.

28. A method for producing a semiconductor light-emitting device having a light-emitting section comprising at least a lower clad layer, an active layer and an uppermost clad layer which are formed on a compound semiconductor substrate, an intermediate layer formed directly on the uppermost clad layer of the light-emitting section and a layer grown directly on the intermediate layer, the intermediate layer having a lattice constant intermediate between a lattice constant of the uppermost clad layer and a lattice constant of the layer grown on the intermediate layer, wherein when growing the layer directly on the intermediate layer in a lattice mismatching state in which the absolute value of a lattice matching factor Δa/a is not lower than 0.25% with respect to the intermediate layer, a growth rate at least at a start time of growth is less than 1.0 μm/h and the growth rate is increased to a rate above 1.0 μ/h during growth of the layer grown directly on the intermediate layer.

29. A method for producing a semiconductor light-emitting device as claimed in claim 28, wherein the layer grown on the intermediate layer includes at least one of a current diffusion layer and a current stopping layer.

30. A method for producing a semiconductor light-emitting device as claimed in claim 28, wherein the intermediate layer is comprised of two or more layers.

31. A method for producing a semiconductor light-emitting device having a light-emitting section comprising at least a lower clad layer, an active layer and an uppermost clad layer on a compound semiconductor substrate, an intermediate layer formed directly on the uppermost clad layer of the light-emitting section and a layer grown on the intermediate layer, the intermediate layer having a lattice constant intermediate between a lattice constant of the uppermost clad layer and a lattice constant of the layer grown on the intermediate layer, wherein when growing the intermediate layer directly on the uppermost clad layer in a lattice mismatching state in which the absolute value of a lattice matching factor Δa/a is not lower than 0.25% with respect to the uppermost clad layer and when growing the layer on the intermediate layer in a lattice mismatching state in which the absolute value of the lattice matching factor Δa/a is not lower than 0.25% with respect to the intermediate layer, a growth rate at least at a start time of growth is less than 1.0 μm/h and is increased to a higher growth rate before ending growing the layer on the intermediate layer.

32. A method for producing a semiconductor light-emitting device as claimed in claim 31, wherein the layer grown on the intermediate layer includes at least one of a current diffusion layer and a current stopping layer.

33. A method for producing a semiconductor light-emitting device as claimed in claim 31, wherein the intermediate layer is comprised of two or more layers.

34. A method for producing a semiconductor light-emitting device as claimed in claim 31, wherein at least one layer which the growth rate at the start time of growth is less than 1.0 μm/h is made to have a growth rate of greater than 1 μm/h except when starting the growth.

35. A method of making a semiconductor light-emitting device, the method comprising:

forming a lower clad layer on a compound semiconductor substrate;

forming an active layer on the lower clad layer;

forming an upper clad layer on the active layer to form a light-emitting section together with the lower clad layer and the active layer;

forming an intermediate layer on the upper clad layer;

forming a current diffusion layer on the intermediate layer;

wherein a lattice constant of the intermediate layer is between a lattice constant of the upper clad layer and a lattice constant of the current diffusion layer;

wherein an absolute value of a lattice matching factor Δa/a between the current diffusion layer and the intermediate layer is 0.25% or more; and wherein an initial portion of the current diffusion layer is formed at a first growth rate, and thereafter another portion of the current diffusion layer is formed at a second growth rate that is different than the first growth rate.

36. A method as claimed in claim 35, wherein the lower clad layer, the active layer, the upper clad layer, the intermediate layer, and the current diffusion layer and a current stopping layer each comprise $(Al_xGa_{1-x})_yIn_{1-y}P$ ($0 \leq x \leq 1$, $0 \leq y \leq 1$).

37. A method of claim 35, wherein the lower clad layer, the active layer and the upper clad layer comprise $(Al_xGa_{1-x})_yIn_{1-y}P$ ($0 \leq x \leq 1$, $0 \leq y \leq 1$) and the current diffusion layer comprises GaP.

38. A method of claim 35, wherein the lower clad layer, the active layer, the upper clad layer, the intermediate layer, and the current diffusion layer are grown by a metal-organic chemical vapor deposition method.

39. The method of claim 35, wherein the first growth rate is lower than the second growth rate.

40. The method of claim 39, wherein the first growth rate is not greater than 1.0 μm/h.

41. The method of claim 35, wherein the first growth rate ranges from 0.8 to 1.0 μm/h, and the second growth rate ranges from more than 1.0 μm/h to 10.0 μm/h.

* * * * *